US005967156A

United States Patent [19]
Rose et al.

[11] Patent Number: 5,967,156
[45] Date of Patent: Oct. 19, 1999

[54] PROCESSING A SURFACE

[75] Inventors: Peter H. Rose, North Conway, N.H.; Piero Sferlazzo, Lynnfield, Mass.

[73] Assignee: Krytek Corporation, Danvers, Mass.

[21] Appl. No.: 08/335,327

[22] Filed: Nov. 7, 1994

[51] Int. Cl.[6] .......................... H01L 21/304; H01L 21/306
[52] U.S. Cl. .................................. 134/7; 216/58; 216/57; 156/640.1
[58] Field of Search ................................... 134/7; 216/58, 216/57; 156/640.1

[56] References Cited

U.S. PATENT DOCUMENTS

| | | |
|---|---|---|
| 1,899,626 | 2/1933 | Miller . |
| 2,699,403 | 1/1955 | Courts . |
| 3,074,822 | 1/1963 | Walk .......................................... 134/7 |
| 3,214,867 | 11/1965 | Henning ...................................... 134/7 |
| 3,270,464 | 9/1966 | Bowling, Jr. et al. . |
| 3,545,996 | 12/1970 | Duncan . |
| 3,676,963 | 7/1972 | Rice et al. . |
| 3,702,519 | 11/1972 | Rice et al. . |
| 3,704,822 | 12/1972 | Nomura . |
| 3,708,993 | 1/1973 | Hardt et al. . |

(List continued on next page.)

FOREIGN PATENT DOCUMENTS

| | | |
|---|---|---|
| 0 332 356 A2 | 9/1989 | European Pat. Off. . |
| 0 461 476 A2 | 12/1991 | European Pat. Off. . |
| 0 585 936 A2 | 3/1994 | European Pat. Off. . |
| 2 596 672 | 10/1987 | France . |
| 2 146 926 | 5/1985 | United Kingdom . |
| WO 91/03075 | 3/1991 | WIPO . |

OTHER PUBLICATIONS

Elizabeth A. Hill, "Carbon Dioxide Snow Examination and Experimentation", pp. 36–39, PC Feb., 1994.
Phelps et al., "Effects of Fluid Dynamics on Cleaning Efficacy of Supercritical Fluids", Prepared for U.S. Department of Energy under Contract De–AC06–76RLO 1830, Mar. 1993.
Foster et al., A Centrifuge Accelerator $CO_2$ Pellet Cleaning System, Third Annual International Workshop On Solvent Substitution, Phoenix, Arizona, Dec. 8–11, 1992.
Peterson et al., "Jet Spray Cleaning of Optics", SPIE Proceedings Series, vol. 1754, 23–24 Jul. 1992, San Diego, Calfornia.
Tom et al., Particle Formation with Supercritical Fluids—A Review, J. Aerosol Sci., vol. 22, No. 5, pp. 555–584, 1991.
McDermott et al., "Removing Submicorn Surface Particles Using a Cryogenic Argon–Aerosol Technique", pp. 33–37 Microcontamination, Oct. 1991.
Sherman et al., "Dry surface cleaning using $CO_2$ snow", J. Vac. Sci. Technol. B., vol. 9, No. 4, Jul./Aug. 1991.
McDermott et al., "Surface Cleaning by a Cryogenic Agron Aerosol", Proceedings—Institute of Environmental Sciences, 1991.

(List continued on next page.)

*Primary Examiner*—Sam Silverberg
*Attorney, Agent, or Firm*—Fish & Richardson P.C.

[57] ABSTRACT

In one aspect, foreign material on the surface of a substrate is processed to form a reaction product by: providing a directed flow of a fluid, comprising a reactant, to the vicinity of the foreign material to be processed; and delivering an aerosol of at least partially frozen particles continuously or intermittently to the foreign material to aid the reactant react with the foreign material to form the reaction product. In another aspect, foreign material is processed by: providing a directed flow of a fluid, comprising a reactant, to the foreign material to be processed in a limited area reaction region corresponding to a minor fraction of the total area of the substrate; agitating the foreign material in the limited area reaction region to aid the reactant react with the foreign material to form the reaction product; and providing relative motion between the substrate and the directed flow of fluid to achieve a substantially uniform exposure of the foreign material to fluid flow and the agitation. Infrared or ultraviolet radiation may also be delivered to the foreign material. Specific methods for processing oxide layers, organic layers and metal contamination are also described.

65 Claims, 11 Drawing Sheets

U.S. PATENT DOCUMENTS

| | | |
|---|---|---|
| 3,934,374 | 1/1976 | Leliaert . |
| 3,984,943 | 10/1976 | Kono et al. . |
| 4,038,786 | 8/1977 | Fong . |
| 4,084,357 | 4/1978 | Moses . |
| 4,300,581 | 11/1981 | Thompson . |
| 4,326,553 | 4/1982 | Hall . |
| 4,365,383 | 12/1982 | Bartlett . |
| 4,389,820 | 6/1983 | Fong et al. . |
| 4,401,131 | 8/1983 | Lawson . |
| 4,439,243 | 3/1984 | Titus . |
| 4,458,703 | 7/1984 | Inoue et al. . |
| 4,500,080 | 2/1985 | Aigo . |
| 4,585,517 | 4/1986 | Stemple . |
| 4,597,825 | 7/1986 | Freeouf et al. . |
| 4,631,250 | 12/1986 | Hayashi . |
| 4,655,847 | 4/1987 | Ichinoseki et al. . |
| 4,663,890 | 5/1987 | Brandt . |
| 4,703,590 | 11/1987 | Westergaard . |
| 4,704,873 | 11/1987 | Imaike et al. . |
| 4,705,438 | 11/1987 | Zimmerman et al. . |
| 4,707,951 | 11/1987 | Gibot et al. . |
| 4,727,687 | 3/1988 | Moore . |
| 4,744,181 | 5/1988 | Moore et al. . |
| 4,747,421 | 5/1988 | Hayashi . |
| 4,749,440 | 6/1988 | Blackwood et al. . |
| 4,753,051 | 6/1988 | Tano et al. . |
| 4,756,047 | 7/1988 | Hayashi et al. . |
| 4,778,559 | 10/1988 | McNeilly . |
| 4,793,103 | 12/1988 | Baumgart . |
| 4,806,171 | 2/1989 | Whitlock et al. . |
| 4,817,652 | 4/1989 | Liu et al. . |
| 4,832,753 | 5/1989 | Cherry et al. . |
| 4,857,142 | 8/1989 | Syverson . |
| 4,870,923 | 10/1989 | Sugimoto . |
| 4,871,651 | 10/1989 | McCune, Jr. et al. . |
| 4,900,395 | 2/1990 | Syverson et al. . |
| 4,932,168 | 6/1990 | Tada et al. . |
| 4,936,922 | 6/1990 | Cherry . |
| 4,938,815 | 7/1990 | McNeilly . |
| 4,962,891 | 10/1990 | Layden . |
| 4,974,375 | 12/1990 | Tada et al. . |
| 5,001,873 | 3/1991 | Rufin . |
| 5,009,240 | 4/1991 | Levi . |
| 5,018,667 | 5/1991 | Lloyd . |
| 5,022,961 | 6/1991 | Izumi et al. . |
| 5,025,597 | 6/1991 | Tada et al. . |
| 5,026,155 | 6/1991 | Ockovic et al. . |
| 5,035,750 | 7/1991 | Tada et al. . |
| 5,044,129 | 9/1991 | Olevitch . |
| 5,044,314 | 9/1991 | McNeilly . |
| 5,062,898 | 11/1991 | McDermott et al. . |
| 5,074,083 | 12/1991 | Kanno et al. . |
| 5,081,068 | 1/1992 | Endo et al. . |
| 5,108,512 | 4/1992 | Goffnett et al. . |
| 5,119,637 | 6/1992 | Bard et al. . |
| 5,125,979 | 6/1992 | Swain et al. . |
| 5,147,466 | 9/1992 | Ohmori et al. . |
| 5,209,028 | 5/1993 | McDermott et al. . |
| 5,228,206 | 7/1993 | Grant et al. . |
| 5,231,865 | 8/1993 | McDermott et al. . |
| 5,234,540 | 8/1993 | Grant et al. . |
| 5,279,705 | 1/1994 | Tanaka . |
| 5,289,263 | 2/1994 | Kiyokawa et al. . |

OTHER PUBLICATIONS

"Cleaning with Supercritical $CO_2$", NASA Tech Briefs, Dec. 1990.

Layden et al., "High velocity carbon dioxide snow for cleaning vacuum system surfaces", J. Vac. Sci. Technol. A 8 (5), Sep./Oct. 1990.

Peterson et al., "Contamination Removal by $CO_2$ Jet Spray", SPIE Proceedings Series, vol. 1329, 10–12 Jul. 1990, San Diego, California.

Sherman et al., "The removal of hydrocarbons and silicone grease stains from silicon wafers", J. Vac. Sci. Technol. B 8 (3), May/ 1990.

"Ice Scrubbing Effective, Flag Raised Over Organic–Vapor Contamination", Semiconductor International Nov. 1990.

Ohmori et al., "Ultra Clean Ice Scrubber Cleaning with Jetting Fine Ice Particles", J. Electrochem. Soc., vol. 137, No. 8, Aug. 1989.

Hoenig et al., "Control of Particulate Contamination by Thermophoresis, Electrostatics and Dry Ice Techniques", 9th ICCCS Processdings 1988.

ARCO Bulletin, Spectra–Clean™ $CO_2$ .

"Cleaning Surfaces with Dry Ice", Compressed Air Magazine, Aug. 1986.

Hagena et al., "Cluster Formation in Expanding Supersonic Jets: Effect of Pressure, Temperature, Nozzle Size and Test Gas", The Journal of Chemical Physics, vol. 56, No. 5, Mar. 1, 1972.

"Dry Ice Particles Used to Remove Contaminants", Chem. Show Preview, (Before Nov. 1993).

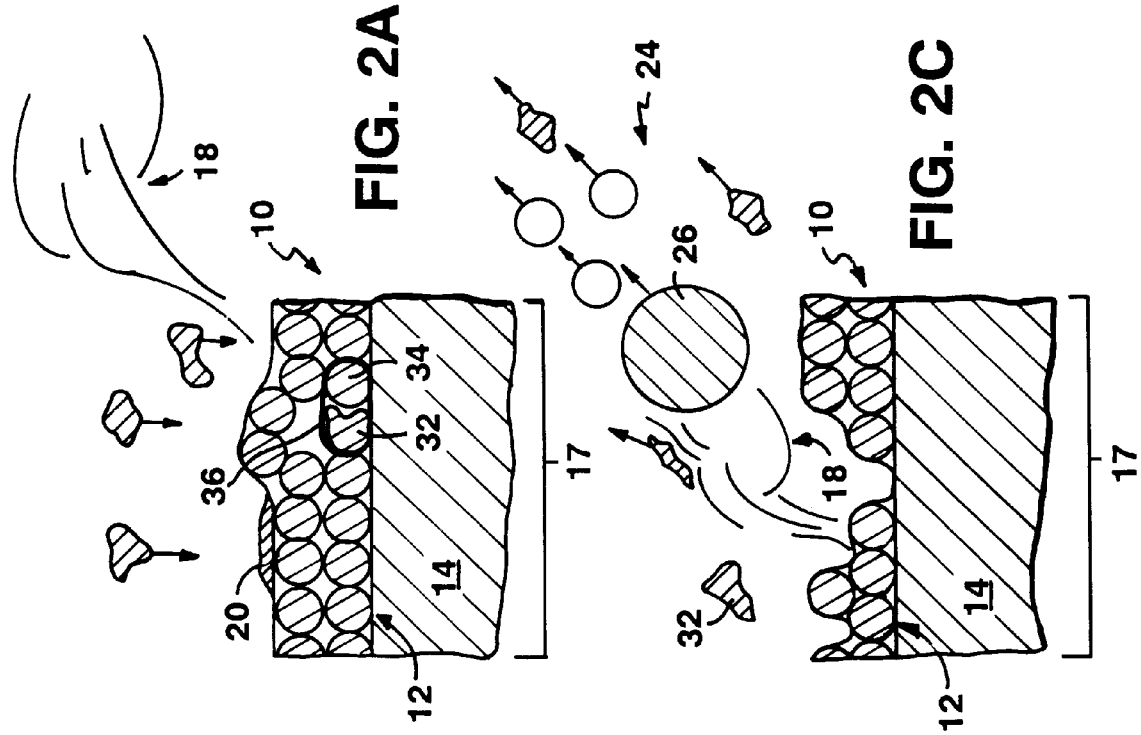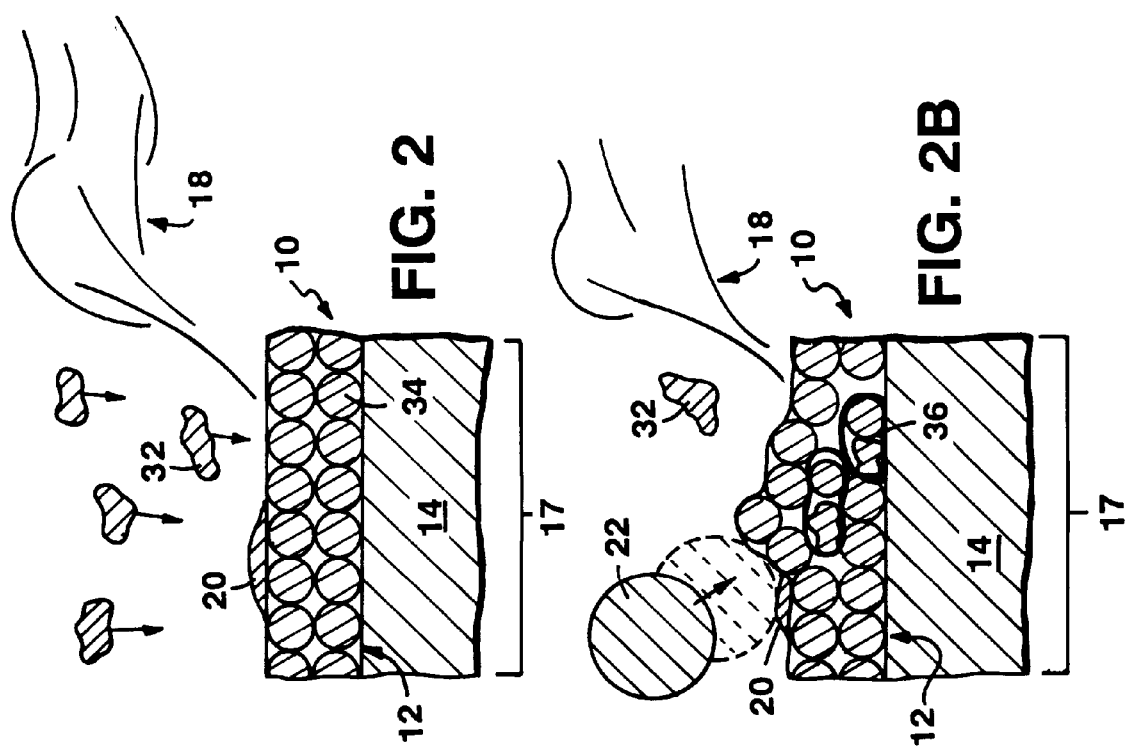

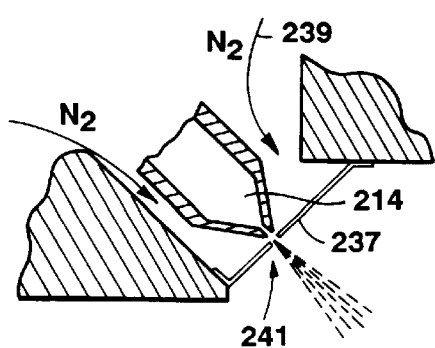
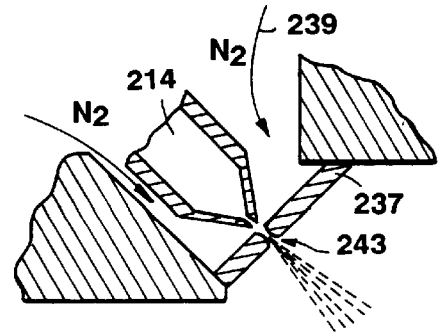
FIG. 10A    FIG. 10B
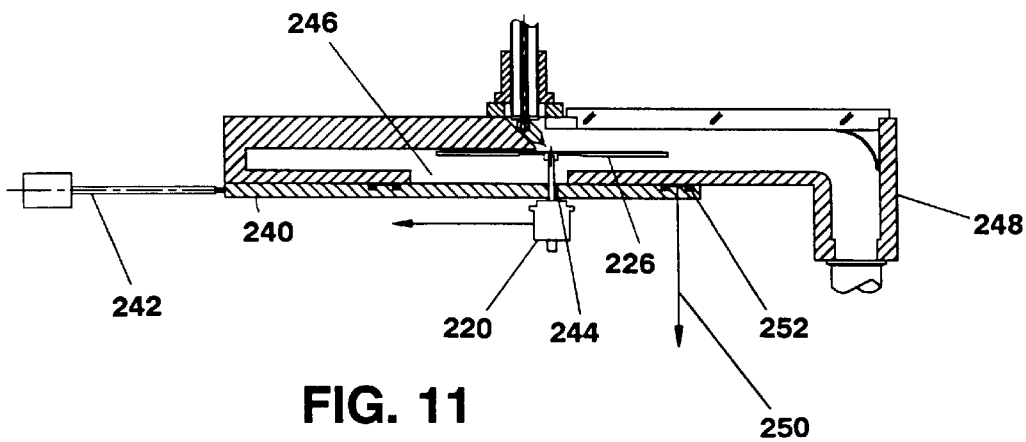
FIG. 11
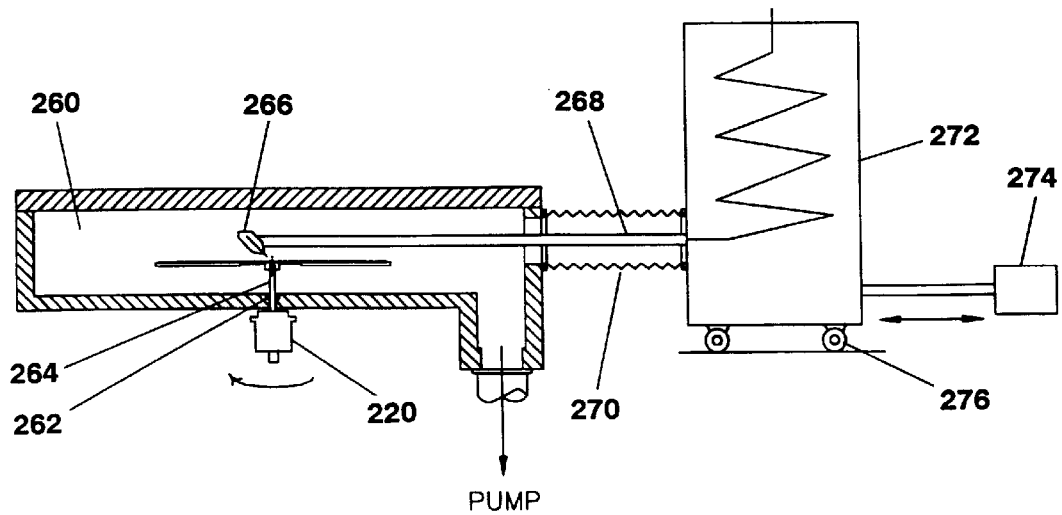
FIG. 12

PROCESSING A SURFACE

BACKGROUND

This application relates to surface processing.

Surface cleaning is an important step in making, e.g., semiconductor memories, printed circuits, flat panel displays, and CD-ROMS. Foreign material on a wafer surface has a direct bearing on process yields, especially as device sizes become smaller. Even a very small fraction of a monolayer of sodium ion contamination on the surface of an integrated circuit may cause the circuit to malfunction.

The size of the smallest particle capable of causing a defect in an integrated circuit is decreasing as the semiconductor industry pushes for smaller circuit dimensions. For example, the target resolution for the next generation of semiconductor devices is 0.35 $\mu$m or less, which is already beyond the removal capability of many cleaning technologies. According to a well-accepted rule, foreign material on the order of one tenth of the size of the target resolution should be removed to make a fabrication process commercially viable. Accordingly, surface cleaning processes should remove foreign material on the order of 0.03 $\mu$m in size from the surface of next generation's semiconductor wafers.

In semiconductor cleaning technology, most surface cleaning systems use chemicals in large volumes of purified deionized water that are selected to remove thin organic or oxide films and metal residues. Typically, these cleaning systems require immersing a silicon wafer in a prescribed sequence of one or more baths of liquid cleaning solutions on a wet bench. To reduce the consumption of these expensive solutions, which are also difficult and expensive to dispose of, a number of alternative liquid-based schemes have been devised. For example, in spray cleaning, the liquid cleaning solutions are dispensed as a spray over the surface of a wafer. More recently, a continuous flow liquid cleaning technique has been developed that combines the efficiency of wet bench cleaning and the low consumption features of spray cleaning. Other liquid-based technologies include scrubbing with special rotary brushes, ultrasonic and megasonic cleaners, and liquid jets. Recontamination resulting from recirculation and reuse of liquid chemicals is a potential problem that can only be solved by continuous regeneration on replacement of the cleaning solutions, which considerably increases the costs of the surface cleaning process.

Wafer cleaning chemistry has remained essentially unchanged over the past 25 years, the most prevalent method in the industry still being a hydrogen peroxide-based wet-chemical process. One of the most common cleaning methods in the semiconductor industry is the RCA Standard Clean, in which wafers are immersed in several chemicals sequentially to remove particles, metallic contamination, organic contamination and native oxides. A very typical example of the RCA cleaning process is shown in FIG. 14. Typically, a cassette of 25 wafers is moved from one liquid bath to the next in the sequence shown.

Since cleaning represents 30% of all the process steps of the fabrication process and very large amounts of water (~1000 gallons/wafer) and chemicals are consumed. After the final rinse, the substrate must be dried, and to avoid "water marks", isopropyl alcohol (IPA) is often used as a drying agent, which again poses an environmental hazard. The process is therefore expensive and increasingly so as wafer sizes increase, and has a considerable and increasingly worrisome negative environmental impact.

Consequently, there has been a significant desire to move toward gas-phase dry-cleaning processes, such as aerosol surface cleaning, and away from current liquid-based cleaning technologies which require large volumes of cleaning agents (acids, bases and solvents) and larger volumes of deionized rinse water, which must be properly disposed of at a great expense.

As used herein, we intend the term "aerosol" to broadly refer to a gaseous suspension of microscopic particles of a liquid, a solid, or a mixture of solid and liquid. We will use the term "inert" to refer to a substance that is not chemically detrimental to a surface to be cleaned.

Aerosols of carbon dioxide snow have been used for many years to clean surfaces. For example, Swain et al. (U.S. Pat. No. 5,125,979, which is herein incorporated by reference) describe a scheme in which liquid carbon dioxide is expanded from an orifice into a thermally insulated chamber to form small carbon dioxide particles. The small carbon dioxide particles are retained in the insulated chamber until they agglomerate into large snowflakes, at which point the snowflakes are accelerated within a nozzle by a high velocity vortex of inert gas and directed against a surface to be cleaned.

Levi (U.S. Pat. No. 5,009,240, which is herein incorporated by reference) describes a wafer cleaning system which cleans semiconductor wafers by sandblasting them with ice particles. In this system, a stream of gas entrains frozen ice particles through an L-shaped conduit to the surface of a wafer to be cleaned. After the semiconductor wafer is sandblasted with ice, residual ice is removed by evaporation.

Aerosols of solid cryogenic argon particles have also been used to clean contamination from a substrate surface. McDermott et al. (U.S. Pat. Nos. 5,209,028 and 5,062,898, both of which are herein incorporated by reference) disclose a semiconductor wafer cleaning system in which a pressurized gaseous argon-containing stream, which is at a temperature above the liquefaction point of argon, is expanded and thereby solidified to form an aerosol of frozen argon particles. The resulting aerosol is directed at a surface of wafer to be cleaned. Preferably a nitrogen carrier gas is used to accelerate the argon particles.

As used herein, we intend the term "cryogenic" to broadly refer to a physical substance (atoms, compounds, molecules, or a mixture of one or more of these components) in which at least one of its physically separable constituent components has a liquefaction temperature of less than about 110° K. at atmospheric pressure (e.g., argon, hydrogen, helium, nitrogen, oxygen, air, or methane).

Different compounds have been used in the formation of particulate cleaning aerosols. For example, Ohmori et al. (U.S. Pat. No. 5,147,466, which is herein incorporated by reference) describe a surface cleaning technique which uses an aerosol of frozen particles formed from various compounds selected based on the hardness of the resulting frozen particle. The compounds from which these aerosols are formed include water, methanol, glycerin, and freon 113.

Attempts have been made to use ultraviolet light in combination with particulate cleaning aerosols to enhance surface treating results. For example, Endo et al. (U.S. Pat. No. 5,081,068, which is herein incorporated by reference) describe a scheme in which ice particles containing hydrogen peroxide are jetted onto a substrate surface where they melt to form a hydrogen peroxide solution. Ultraviolet light in the wavelength range of at least 180 nm to 260 nm is directed at the substrate surface and is absorbed by the melted hydrogen peroxide to produce hydroxyl radicals, which oxidize the substrate and organic materials on the substrate surface.

While such proposed cleaning schemes may be effective, improved cleaning results are possible, which may enable such dry processes to be commercially successful. This is especially true in the semiconductor industry, where it is necessary to clean semiconductor substrates at least as well as currently used wet cleaning techniques.

SUMMARY

In a general aspect, the invention features a scheme for processing foreign material on the surface of a substrate to form a reaction product comprising the steps of: providing a directed flow of a fluid, comprising a reactant, to the vicinity of the foreign material to be processed; and delivering an aerosol of at least partially frozen particles to the foreign material to aid the reactant react with the foreign material to form the reaction product.

Embodiments according to this aspect of the invention may include one or more of the following features. In certain preferred embodiments, the aerosol is delivered to transfer momentum to the foreign material or to the reaction product sufficient for removal thereof from the substrate surface. The step of providing a directed flow of a fluid may comprise delivering the fluid to a limited area reaction region of the foreign material at any given time. The limited area reaction region is preferably approximately 0.1 cm² to 4 cm² in area, and more preferably about 1 cm² in area. The aerosol is preferably delivered to the limited area reaction region. In certain preferred embodiments, the reaction region has an elongated length dimension and a width dimension that is narrow relative to the length dimension.

The method may further comprise the step of scanning the substrate to achieve a substantially uniform exposure of the foreign material to the fluid and to the aerosol. The step of scanning may comprise the step of moving the substrate while maintaining the directed flow of fluid stationary. For example, the substrate may be linearly translated relative to the directed flow of fluid, the substrate may be rotated about an axis, or the substrate may be translated in two orthogonal directions. For an elongated reaction region having a length equal to the length of one dimension of the substrate, the substrate may be scanned in a direction perpendicular to the elongated dimension of the reaction region so as to expose the entire surface of the substrate to the reaction region. The aerosol and the directed flow of fluid may be continuously provided while the reaction region is scanned, or the aerosol may be delivered as a series of intermittent pulses (e.g., at a rate of about once every 5 seconds) while the fluid is delivered continuously. Alternatively, the entire surface of the substrate may be scanned by the fluid in multiple passes and after each pass the aerosol may be scanned over the entire substrate surface.

Light (e.g., infrared or ultraviolet light) may be delivered to the foreign material to be processed to further aid the reactant react with the foreign material. In certain preferred embodiments, the delivered light has a wavelength that is absorbed by the reactant in a manner increasing the reactivity of the reactant. For example, the reactant may comprise HF and the light that is delivered to the foreign material to be processed may comprise light having a wavelength of about 248 nm.

The directed flow of fluid may include one or more of the following fluids: a gaseous flow of hydrogen fluoride; ozone; isopropyl alcohol vapor; and a flow of water vapor. The fluid is preferably provided at a flow rate selected to provide sufficient quantity of reactant to the vicinity of the foreign material for efficient processing (e.g., at a flow rate of at least 1 SCFM). The average energy of the particles of the aerosol is selected to achieve efficient cleaning (e.g., the average size of the aerosol particles is selected to include between $10^7$ and $10^{10}$ atoms per particle, with each atom having an average energy between 0.1 meV and 0.01 eV) The particles of the aerosol preferably impact the foreign material with an average velocity between 2,000 cm/sec and 30,000 cm/sec, and more preferably between 5,000 cm/sec and 10,000 cm/sec. In certain embodiments, the velocity of the aerosol particles is preferably selected to be above that required for cleaning and below that which would cause damage to the substrate. The at least partially frozen aerosol particles may comprise one or more of the following compounds: argon, carbon dioxide, hydrogen fluoride, water, and ammonia.

In certain preferred embodiments, the steps of providing a directed flow of a fluid and delivering an aerosol are preferably performed in sequence. For example, the step of providing a directed flow of a fluid may be initiated after the aerosol is delivered to the foreign material. At least two different aerosols of at least partially frozen particles (e.g., argon and carbon dioxide) may be delivered to the foreign material on the substrate.

The reaction product is preferably removed from the vicinity of the wafer surface. For example, a purge gas may be delivered to the region on the surface where the reaction product forms. Preferably, the purge gas is delivered is delivered as a laminar flow over the substrate surface. In addition, the process chamber is preferably aerodynamically shaped to reduce recirculation therein. A vacuum exhaust may be provided in the vicinity of the substrate.

In another aspect, the invention features a scheme for processing foreign material on the surface of a substrate to form a reaction product comprising the steps of: providing a directed flow of a fluid, comprising a reactant, to the foreign material to be processed in a limited area reaction region corresponding to a minor fraction of the total area of the substrate; agitating the foreign material in the limited area reaction region to aid the reactant react with the foreign material to form the reaction product; and providing relative motion between the substrate and the directed flow of fluid to achieve a substantially uniform exposure of the foreign material to the fluid flow and agitation.

Embodiments according to this aspect of the invention may include one or more of the following features. The step of agitating the foreign material preferably comprises transferring by impact momentum to the foreign material sufficient to dislodge a portion of the foreign material from the substrate surface. The step of agitating the foreign material preferably comprises the step of delivering an aerosol of at least partially frozen particles to the limited area reaction region of the foreign material. The step of providing a directed flow of a fluid preferably comprises delivering the fluid to a limited area reaction region of the foreign material at any given time. The limited area reaction region is preferably approximately 0.1 cm² to 4 cm² in area, and more preferably about 1 cm² in area. The step of delivering an aerosol preferably comprises delivering the aerosol particles to the limited area reaction region. The substrate is preferably scanned relative to the directed flow of fluid to achieve a substantially uniform exposure of the foreign material to the fluid. The substrate may be scanned by moving the substrate while maintaining the directed flow of fluid stationary. For example, the substrate may be linearly translated relative to the directed flow of fluid and/or the substrate may be rotated about an axis.

In yet another aspect, the invention features a scheme for processing an oxide layer on a substrate surface comprising the steps of: providing a directed flow of a fluid, comprising a reactant selected to react with the oxide layer to form a reaction product, to the vicinity of the oxide layer to be processed; and delivering an aerosol of at least partially frozen particles to the oxide layer to aid the reactant react with the oxide layer primarily by enhancing the removal of reaction products.

Embodiments according to this aspect of the invention may include one or more of the following features. The reactant that is provided comprises a mixture of a carrier gas (e.g., nitrogen), hydrogen fluoride and water vapor, which is provided at a temperature of about 60° C. The at least partially frozen aerosol particles that are delivered preferably comprise argon particles. Light is preferably applied to the oxide layer to be processed. For example, infrared light, which is absorbed by silicon dioxide, may be applied to maintain the temperature of the oxide layer to be processed between 70° C. and 80° C. After the oxide layer has been processed, a pacification gas (e.g., hydrogen or a dilute mixture of HF in a carrier gas) is preferably applied to the silicon surface from which the oxide layer has been removed.

In another aspect, the invention features a scheme for processing metal contamination on a substrate surface comprising the steps of: providing a directed flow of a fluid, comprising a reactant (e.g., chlorine gas at an elevated temperature of 200° C.) selected to react with the metal contamination to form a reaction product, to the vicinity of the metal contamination to be processed; and delivering an aerosol of at least partially frozen particles to the metal contamination to aid the reactant react with the metal contamination to form a reaction product.

Embodiments according to this aspect may include one or more of the following features. The reactant that is provided preferably comprises a mixture of a carrier gas, chlorine, water vapor, or isopropyl alcohol. Ultraviolet light is preferably applied to the metal contamination to be processed. Also, a purge gas is preferably supplied over the metallic contamination being processed to aid the removal of the reaction product from the vicinity of the substrate surface. After processing, a flow of ozone and ultraviolet light is preferably provided in the vicinity of the substrate surface, whereby a thin protective oxide layer is formed on the surface of the substrate, if that surface is, e.g., silicon.

In yet another aspect, the invention features a method for processing organic contamination on a substrate surface comprising the steps of providing a directed flow of a fluid, comprising a reactant selected to react with the organic contamination to form a volatile reaction product, to the vicinity of the metal contamination to be processed, and delivering an aerosol of at least partially frozen particles to the organic contamination to aid the reactant react with the organic contamination to form a reaction product.

Embodiments according to this aspect may include one or more of the following features. Infrared radiation is preferably delivered to the substrate to heat the substrate to a temperature of about 100° C. Ultraviolet light having a wavelength greater than 150 nm is also preferably delivered to the organic contamination. The steps of delivering the aerosol and providing the fluid are preferably performed in sequence.

Among the advantages of the invention are the following. Rather than filling an entire chamber with process gases at the required concentrations, the nozzles need only supply enough reactant gas to cover the process area at the desired concentration. Because of the lower gas flows, the concentration level at the reacting surface can be raised. For reactions with second order or higher rate constants this will reduce both reaction times and overall gas flows. Thermally activated etching processes will occur at rates many orders of magnitude lower on the chamber walls than on a local hot spot on the wafer due to Arrhenius' law, and several more orders of magnitude lower due to the lower concentration of active species near the chamber wall. Optically activated processes will be similarly concentrated at the wafer surface. This reduces reactions at the chamber walls thus increasing chamber lifetime.

In localizing the reaction region to a small area of the substrate surface, uniformity of a complex set of parameters is obtained, which is not easily possible by immersion techniques. It is difficult to get a process to work uniformly over an entire wafer. If a reaction is thermally activated and the reaction rate (R) depends exponentially on the temperature (T), slight variations in temperature will result in large variations in reaction rate across a substrate, as indicated by:

$$R \propto e^{\frac{-\theta_q}{k_B T}} \quad (1)$$

If the reaction rate of a radiation enhanced process is proportional to radiation power density, any non-uniformities in the optics or illumination system will result in non-uniform reaction rates, requiring expensive optical systems to compensate. Scanning averages out non-uniformities so less expensive lower precision optical systems can be used. If a reaction's rate is dependent on reactant transfer from a liquid or gas medium by diffusion across a boundary layer to the surface where the reaction occurs, variations in the thickness of the boundary layer will result in non-uniform reaction rates. The high flow rates achievable over a small area enable high gas velocities to be applied to the substrate, as well as providing turbulent flow and extremely thin boundary layers (of the order of microns). If a small reaction zone is scanned over a substrate, the substrate uniformly experiences an equal amount of time under the center of the reaction zone, and under its slower-acting fringes, so that non-uniformities in the reaction zone are averaged out. Higher reaction rates can also be achieved by using radiation power levels that would be impractical over an entire substrate. If a reaction rate is positively nonlinear with radiative power or temperature, this will allow faster processing of an entire wafer for the same total input power. Many chemical film removal processes leave behind particulate or film like debris, which has to be removed in a separate cleaning step. The present invention, on the other hand, substantially prevents buildup of debris during processing or removes it immediately after processing, and at the same time leaves a cleaner surface for chemical action.

Implementations of the present invention are highly vacuum compatible and can be easily integrated in existing cluster tool processing systems, which allows a compatible throughput at reduced cost compared to wet cleaning processes.

Other features and advantages of the invention will become apparent from the following description and from the claims.

DESCRIPTION

FIGS. 2–2C are diagrammatic enlarged side views of a region on the surface of the substrate of FIG. 1 showing a possible sequence of events during processing.

FIG. 10 is a cross-sectional side view of an alternative processing system. FIGS. 10A and 10B are enlarged views of alternative aerosol-generating nozzle shielding schemes.

FIGS. 11 and 12 are cross-sectional side views of alternative processing systems.

Figure 1:
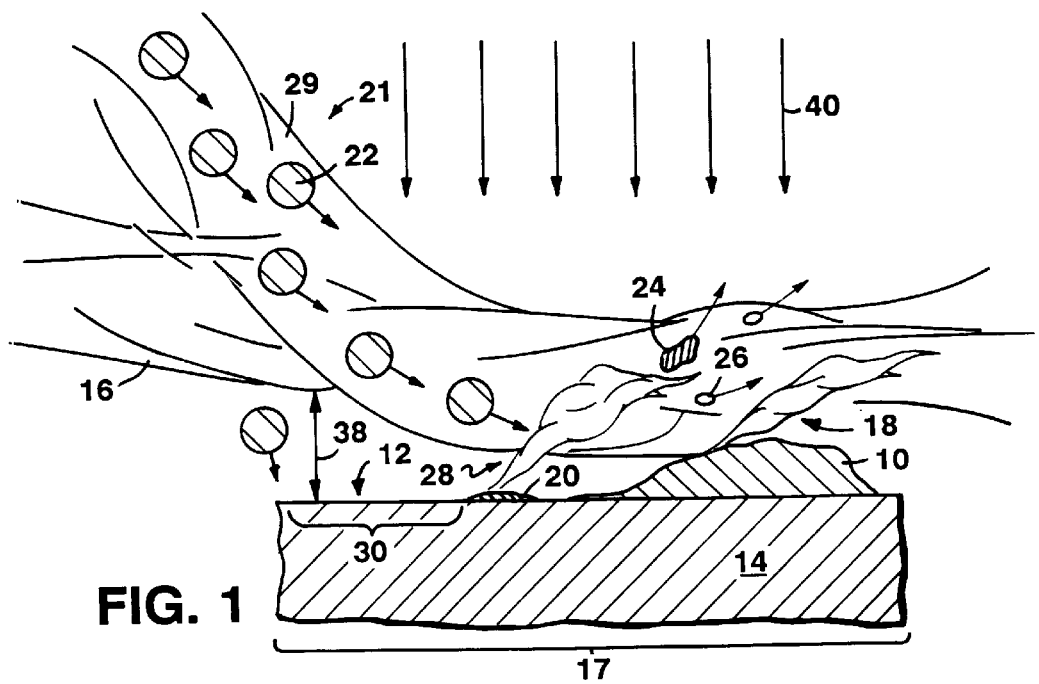
FIG. 1 is a diagrammatic side view of foreign material on the surface of a substrate being processed.

Referring to FIG. 1, foreign material 10 (e.g., contaminants, such as particles, dust, lint, metals; organic layers, such as patterned photoresist layers, oils and fingerprints; or residues) may be removed from a surface 12 of a substrate 14 by providing to the vicinity of the foreign material a directed flow of a fluid 16 (e.g., a gas or vapor), which includes a reactant. The reactant is selected to react with the foreign material in a reaction region 17 to produce a reaction product, which may, e.g., be a volatile product 18 or a non-volatile residue 20. An aerosol 21 of at least partially frozen particles 22 is directed at the region of the foreign material to be processed to aid the reactant react with the foreign material to form a reaction product.

In general, the chemical action of the reactant alone is insufficient to completely clean the foreign material from the substrate surface. This is due, at least in part to the formation of non-volatile residues that, e.g., inhibit the reaction of the reactant with underlying foreign material. We have realized that by combining physical agitation, e.g., in the form of an aerosol of at least partially frozen particles, surfaces can be sufficiently cleaned to undergo subsequent processing steps. It is speculated that the action of the aerosol particles is similar to the action of a surfactant or a megasonic excitation often employed to enhance cleaning actions in liquid baths. This action has hitherto been lacking in dry processing with the result that, e.g., non-volatile residues are left behind, greatly reducing the effectiveness of dry processing.

Aerosol particles 22 impact the foreign material or the reaction product (e.g., non-volatile residue 20) and transfer sufficient energy to dislodge impact by-products 24 (e.g., portions of foreign material 10 and reaction products, such as non-volatile residue 20) from the surface. Impact by-products 24 are released from the surface if the transferred energy is sufficient to overcome the adhesion energy holding them to the surface. After aerosol particles 22 impact the substrate or substance on the surface, the aerosol particles may be removed from the vicinity of surface 12 in the form of particles 26 or they may evaporate into a gas 28, depending on process conditions.

Referring to FIGS. 2–2C, in one possible processing sequence, reactant 32 diffuses toward reaction region 17, which includes components 34 (e.g., silicon oxide), on surface 12 of substrate 14 (e.g., a silicon wafer). As shown in FIG. 2A, reactant 32 reacts with components 34 to form a reaction product. The reaction product may escape the substrate surface as a volatile product 18, it may instead form a non-volatile residue 20 on the substrate surface, or it may become incorporated as a compound 36 in the substance of the foreign material. Referring to FIG. 2B, an aerosol particle 22 eventually follows a trajectory that intersects reaction region 17. After impacting foreign material 10, impact by-products 24 escape the surface of the substrate as a result of momentum transfer from the aerosol particle (shown by dashed lines at the moment of impact in FIG. 2B) to the foreign material or non-volatile reaction products (FIG. 2C).

We believe aerosol particles 22 aid the reactant to react with the foreign material in several ways. The aerosol particles impacting the foreign material may increase the surface roughness of the foreign material, increasing the effective area of the foreign material available for reaction, thereby increasing the reaction rate between the foreign material and the reactant. The aerosol particles may remove non-reactive components of the foreign material, or non-volatile residues resulting from the reaction between the reactant and the foreign material, exposing reactive foreign material to the reactant. The aerosol particles may also disturb the boundary layer (described in detail below), which increases the diffusion rate of the reactant to the foreign material, increasing the reaction rate of those reactions which are limited by reactant concentration.

Referring again to FIG. 1, fluid flow 16 entrains the impact by-products (e.g., ejected portions of the foreign material) particles 24 and gas 28 and removes them from the vicinity of the cleaned portion 30 of the substrate surface. Fluid flow 16, as well as the gaseous phase 29 of aerosol 21, impinges against the surface of the substrate and flows across the surface, forming a thin boundary layer 38. Generally, the foreign material lies completely within the boundary layer. Therefore, aerosol particles 22 and the reactant in fluid flow 16 must cross boundary layer 38 to be able to aid the removal of foreign material 10.

Although the gas phase alone produces insufficient shearing force to remove the foreign material and non-volatile residues, aerosol particles 22 have sufficient inertia to penetrate the boundary layer and impact the substances on the substrate.

Figure 3:
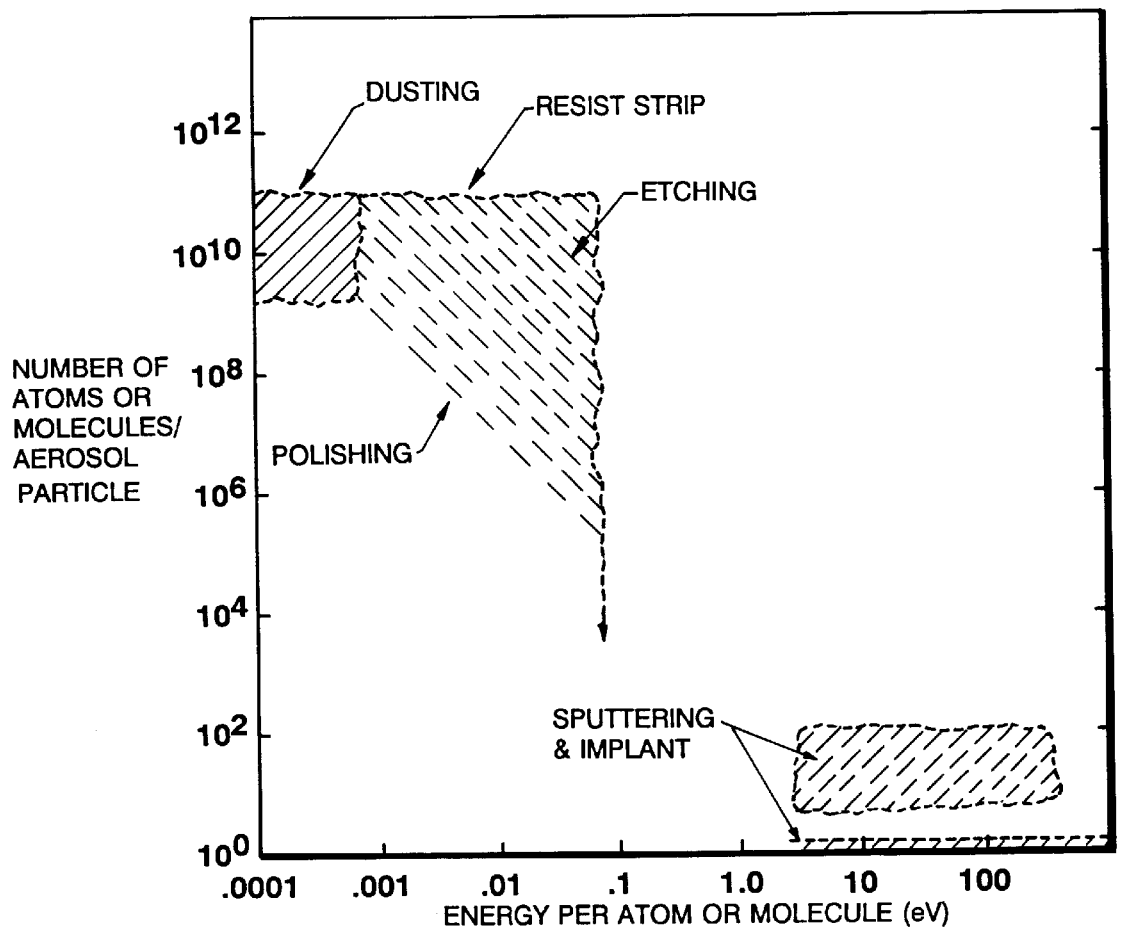
FIG. 3 is a diagram illustrating different cleaning regimes as a function of the average number of particles or atoms per aerosol particle and the average energy per atom or molecule.

Referring to FIG. 3, different "cleaning regimes" (dusting, resist stripping, polishing, etching) can be classified on the basis of the average number of atoms or molecules per aerosol particle (indicative of the average size of the aerosol particles) and the average energy per atom or molecule of the aerosol particles (indicative of the average energy or velocity of the aerosol particles). The size and energy of the particles in the aerosol used for cleaning are selected depending on the desired application. The dusting regime is useful for removing loosely held particles such as silicon dust or small masses of loosely held organic molecules. The resist stripping regime is useful for stripping organic films (e.g., photoresist, fingerprints, and oils) from substrate surfaces. The etching regime would be used for removing, e.g., silicon dioxide films or aluminum layers from substrates. The polishing regime would be selected, e.g., to polish a semiconductor or metallic surface to a mirror-like finish. The sputtering and implant regimes are shown to provide a sense of scale regarding the many orders of magnitude differences in particle sizes and energies that are useful for cleaning relative to the sizes and energies required for sputtering or implanting.

The characteristics of the aerosol particles are selected to achieve efficient cleaning of the foreign material from the surface of the substrate, without damaging the substrate or features on the surface of the substrate. The average size of the aerosol particles is selected to include about $10^7$ to $10^{10}$ atoms (or molecules) per particle, with the average energy of each atom (or molecule) being between about 0.1 meV and 0.01 eV. The average velocity of the aerosol particles is typically maintained between 2,000 cm/sec and 30,000 cm/sec, and more preferably between 5,000 cm/sec and 10,000 cm/sec. Also, depending on the substrate to be cleaned, the so-called "hardness" of the particles may be selected to achieve efficient cleaning without damage.

The reactant crosses boundary layer 38 (FIG. 1) mainly by diffusion. If the rate of a reaction is dependent on reactant transfer from a liquid or gas medium by diffusion across a boundary layer to the substrate surface where the reaction occurs, variations in the thickness of the boundary layer will result in non-uniform reaction rates across the substrate surface.

In general, if a substrate is subjected to a uniform velocity fluid flow, a boundary layer will form having a thickness ($\delta$) of $$\delta = \sqrt{\frac{\mu \cdot X}{\rho \cdot u_\infty}} \quad (2)$$

where X is the distance along the substrate surface, $u_\infty$ is the velocity of the fluid flow, $\mu$ is the viscosity of the fluid, and $\rho$ is the fluid density. The amount of reactant M transported by diffusion across the boundary layer in a given time varies as $$M \propto \frac{1}{\delta^2} \propto \frac{1}{X} \quad (3)$$

Therefore, the amount of reactant reaching foreign material on the surface of the substrate varies inversely with distance along the substrate surface. This results in slower reaction rates at the downstream portion of the substrate, causing non-uniform processing over large substrate areas. If a substantial portion of the reactant is used up during processing, which is desirable for efficient use of process chemicals, the downstream portion of the wafer will experience a different chemical environment than the upstream portion of the wafer. If the reaction rate is limited by the reactant concentration, this will result in non-uniform processing. For a first order reaction, the rate reduction will be proportional to the reduction in reactant concentration. For a second order reaction, where the rate is proportional to $[A]^2$ or $[A][B]$, a 10% reduction in concentration results in a 19% reduction in reaction rate.

We have discovered that by applying fluid flow 16 and aerosol 21 to a limited area reaction region 17 on the substrate surface, combined with scanning of the substrate relative to the directed fluid flow and the aerosol to achieve substantially uniform exposure of the foreign material to the fluid flow and to the aerosol (as described below) significantly improved cleaning results can be achieved. These results are achieved, at least in part, because the central area of reaction region 17, as well as the slower-acting peripheral area, is uniformly scanned over the substrate surface so that non-uniformities are averaged out.

Furthermore, the high flow rates achievable over a small area enable high local gas velocities, turbulent flow, and extremely thin boundary layers (of the order of microns). The time required for a given concentration of reactant to travel a given distance by a diffusive process varies as $\delta^2/K$, where K is the diffusivity and $\delta$ is the boundary layer thickness given by equation 1, above. Therefore, reducing the boundary layer by a factor of 100 can increase a reaction rate by a factor of $10^4$, more than making up for the fact that only part of the surface is being treated. In addition, simultaneous aerosol cleaning will further disturb the boundary layer, increasing the reaction rate.

A first order chemical reaction will take the same amount of time to complete, whether the reactants are spread evenly over the entire processing area or concentrated at a moving reaction region. However, for a second order reaction, in which the reaction rate is proportional to $[A]^2$ or $[A][B]$, focusing the reactants onto an area about 0.01 times the area of the substrate will increase the local reaction rate by a factor of $10^4$, which after scanning the reaction region over the entire substrate surface is a hundred fold increase in processing speed. This can make practical chemical processes that are forbiddingly slow under other conditions.

Also shown in FIG. 1, light 40 is delivered to reaction region 17, corresponding to the area of the foreign material to be processed, to aid the reactant react with the foreign material. Light 40 may be ultraviolet (UV) light or infrared (IR) light, depending upon the foreign material to be processed and the chemical reactions involved in the process. The UV light may enhance the reaction between the reactant and the foreign material by transforming the reactant into a more reactive species or by increasing the reactivity of the surface, e.g., by breaking bonds. At the area of impact of the aerosol/reactant mixture, because of heat transfer to the moving gases, there may be some change in temperature. If this area is cooled by the gas or aerosol, and this is undesirable, IR radiation can be used to restore a uniform temperature at the surface. Alternatively, IR radiation can be used to raise the temperature of the foreign material in the reaction region to promote the reaction between the reactant and the foreign material. UV light and IR light can be simultaneously directed to the same area to control the surface temperature of the wafer in the reactive area.

If the reaction rate of a radiation enhanced process is proportional to radiation power density, any non-uniformities in the optics or the illumination system will result in non-uniform reaction rate. To achieve uniform illumination over an entire substrate at one time requires expensive optics. However, using limited area reaction regions combined with scanning, which averages out non-uniformities, lower precision optical systems can be used. Higher reaction rates can also be achieved by using radiation power levels that would otherwise by impractical over the entire substrate. If a reaction rate is positively non-linear with radiative power or temperature, this will allow faster processing of an entire substrate for the same total input power.

Structure

Figure 4:
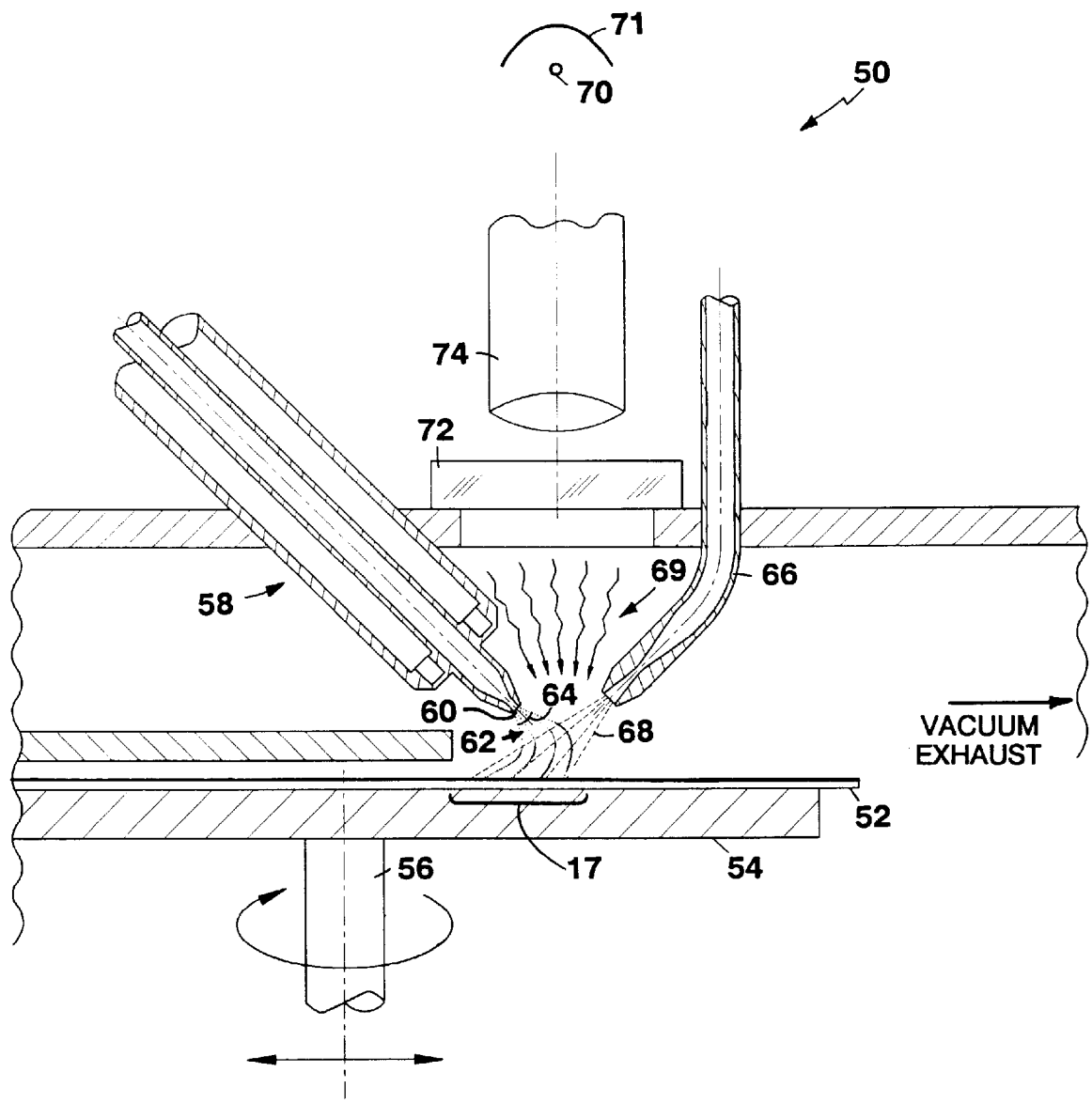
FIG. 4 is a diagrammatic side view of a processing system.

Referring to FIG. 4, in one implementation of a substrate processing system 50, a semiconductor wafer 52 to be cleaned is mounted on a rotatable platen vacuum chuck 54. Chuck 54 is rotated by a shaft 56 at a desired rotational speed, which can be selectively varied synchronously with linear motion of the chuck to produce an almost uniform cleaning action over the wafer surface.

An aerosol of at least partially frozen particles is generated by a nozzle 58, which has an orifice 60 located about 1–2 cm above the wafer surface. The aerosol emerges from orifice 60 as a cone of particles 62 with an opening angle 64 of about 20° so that the aerosol strikes the wafer over an area of approximately 0.1 $cm^2$ to 4 $cm^2$, and more preferably about 1 $cm^2$. This area is dependent on the opening angle of the aerosol jet or cone and the distance of the nozzle from the wafer. A high velocity gas nozzle 66 directs a sub-sonic (less than 30,000 cm/sec) or supersonic (greater than 30,000 cm/sec) flow of gas 68 into aerosol flow 62 so that the aerosol is entrained in the gas emerging from the gas nozzle. The particle velocities will also depend on temperature. The resulting mixture strikes reaction region 17 with the result that the physical action of the aerosol is combined with the selected chemical reaction taking place on the surface of the wafer.

Ultraviolet light 69 is generated, e.g., by a quartz arc lamp 70 having a parabolic reflector that directs the light through a lens 74 (or a mirror system) and a quartz vacuum window 72 onto the substrate. If necessary, IR radiation may be simultaneously directed to the reaction region to control the surface temperature of the wafer. Although crystalline silicon is substantially transparent to infrared radiation, it has been experimentally determined that there is sufficient absorption to heat silicon wafers in this manner. Infrared radiation may be preferred in certain applications to avoid damaging the substrate. The wafer may also be heated by resistive heating of the vacuum chuck 54, which is in direct thermal contact with the wafer.

Figure 4A:
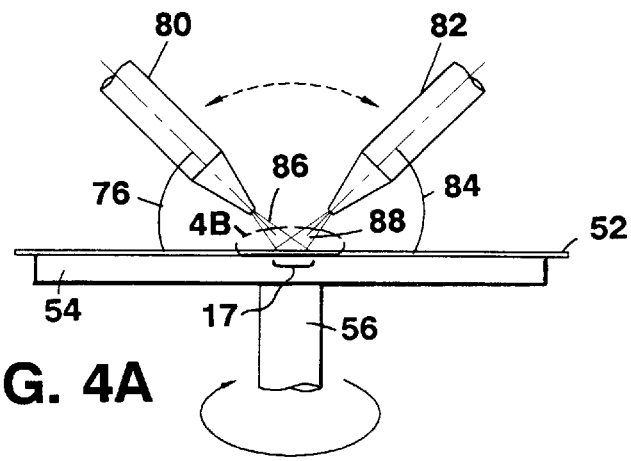
FIGS. 4A and 4B are diagrammatic side views of an alternative processing system.
Figure 4B:
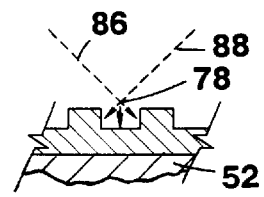

As shown in FIGS. 4A and 4B, the mean angles of impact 76, 84 of cleaning aerosols can be selected, e.g., to clean both sides of a trench 78 which might be patterned on the wafer. In FIG. 4A, two aerosol generating nozzles 80, 82 are shown directing aerosols 86, 88 at different angles 76, 84 onto the wafer surface.

Figure 5:
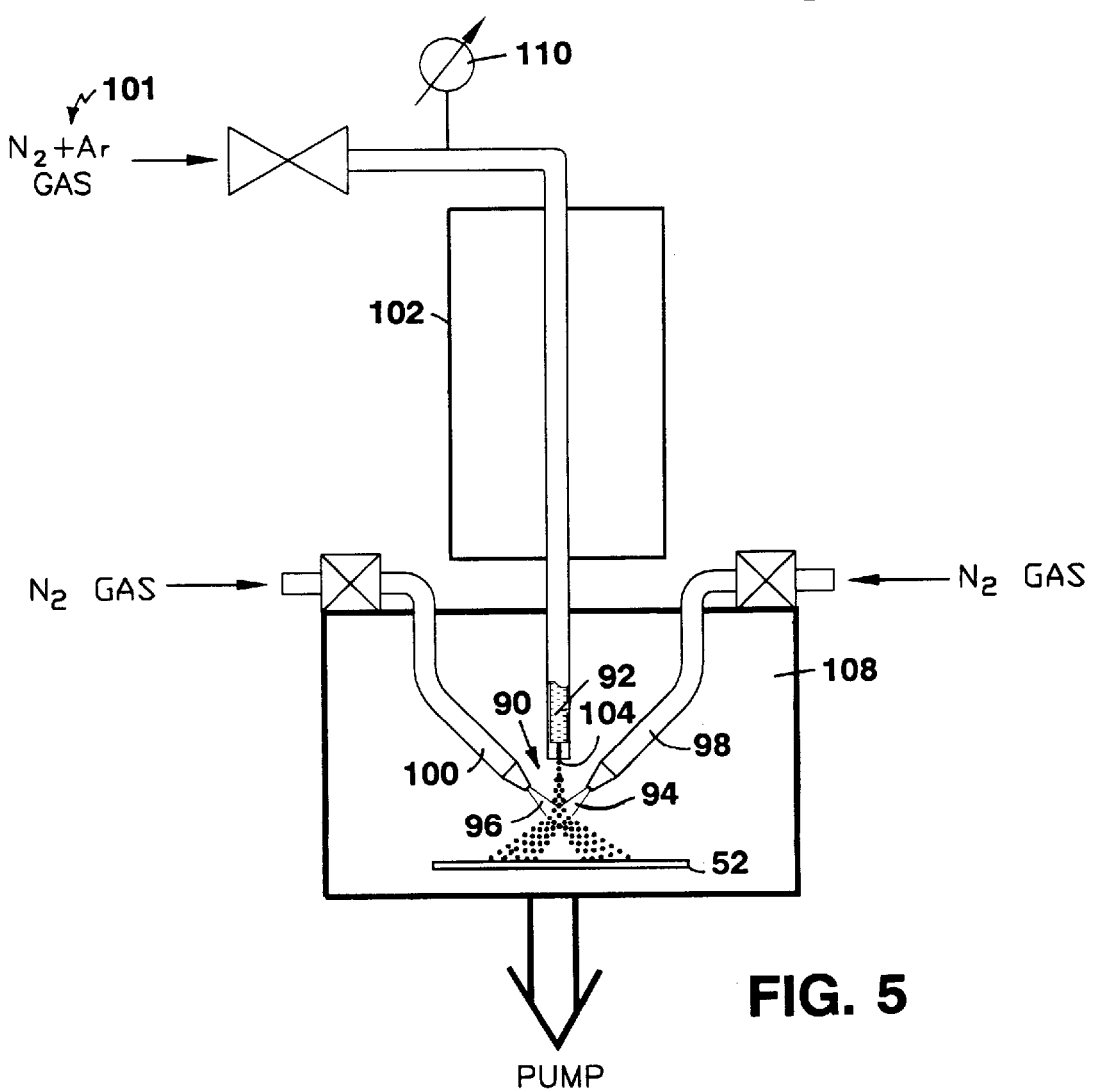
FIG. 5 is a diagrammatic side view of a processing system.

Referring to FIG. 5, in an alternative embodiment, an aerosol 90, which may be of relatively low velocity, is produced by an aerosol-forming expansion nozzle 92 and is subsequently accelerated in high velocity flows 94, 96 of inert gas (e.g., nitrogen) delivered by one or more gas nozzles 98, 100. An input 101 including vapor components (e.g., a mixture of pressurized condensable gases, such as argon and nitrogen) is precooled in a heat exchanger 102 to achieve partial or total liquefaction of the liquid components, which are then expanded through an orifice 104 into a vacuum chamber 108 (maintained at a reduced pressure relative the pressure inside the nozzle), to form a jet of at least partially frozen particles 90.

Whether the aerosol is solid or liquid depends on the particular thermodynamic conditions of the aerosol cleaner. In particular, to achieve frozen particles it is preferable that the pressure within vacuum chamber 108 be maintained below the triple-point of one or more of the liquid components introduced into the heat exchanger 102. For example, in the case of a mixture of argon and nitrogen, the pressure inside the vacuum chamber should be below about 0.68 atm, an preferably at about 0.3 atm, to produce frozen argon particles. A pressure gauge 110, which may be mounted as shown in FIG. 5 or may be mounted on the nozzle itself, is used to monitor the pressure inside the nozzle so that the pressure difference between the nozzle plenum and the vacuum chamber is at a preferred pressure drop or differential (e.g., 45–95 psi, and more preferably about 75 psi).

The aerosol jet of at least partially frozen particles 90 is then intercepted at a location between orifice 104 of aerosol-forming expansion nozzle 92 and a surface of substrate 52 to be cleaned by high velocity gas flows produced through gas nozzles 98, 100, which are designed to provide sonic or supersonic gas jets 94, 96 of high enough velocity and flow rate to be capable of entraining the aerosol jet and directing it toward the surface at high velocities. Preferably, entraining flows 94, 96 increase the velocity of the aerosol to about 5,000–60,000 cm/sec. It has been determined that a more than ten-fold increase in the velocity of the aerosol could be achieved by this technique (e.g., typical aerosol velocities may be increased from 500–2,000 cm/sec to 5,000–60,000 cm/sec).

The orientations of the nozzles, the aerosol jet, and the substrate surface can be varied to achieve optimal cleaning of three-dimensional structures on the surface of the substrate (e.g., to eliminate the shadowing effects of such structures). This is particularly advantageous in the case of patterned semiconductor wafers which require cleaning of deep trenches, vias, side walls and grooves. Preferably, nozzles 98, 100 are oriented to deliver the high velocity gas flows at an angle between 20° and 60° relative to the surface of the substrate.

In a preferred embodiment, the distance between nozzles 98, 100 and the surface is kept as small as possible (e.g., 1–2 cm). Preferably, the intersection point between the low velocity aerosol and the high velocity gas flows is about 0.6–1.25 cm above the surface of the substrate. The distance between the intersection point and orifice 104 of expansion nozzle 92 is also selected to be as close as practically possible.

Figure 5A:
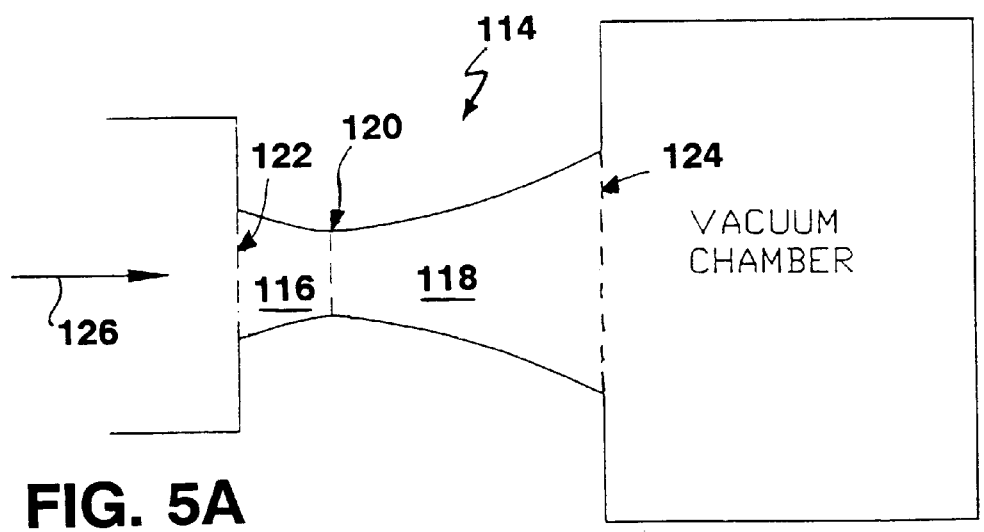
FIG. 5A is a diagrammatic side view of a nozzle.

Referring to FIG. 5A, a supersonic nozzle 114, which may be used for nozzles 98 or 100, includes two conical sections 116, 118; one (116) converging to and one (118) diverging from a reduced diameter throat section 120. In the specific embodiment using an argon-containing aerosol, converging section 116 tapers from an input 122 of inner diameter 0.05 cm to the throat of inner diameter of 0.025 cm, whereas, the diverging section tapers outward for a distance of 0.25 cm from the throat to an output 124 of inner diameter 0.25 cm.

Pressurized nitrogen gas 126 entering the nozzle from the converging section is accelerated to sonic velocities (10,000–30,000 cm/sec) up to the nozzle throat. Since the pressure along the nozzle is decreasing, the effect of the diverging section is to further accelerate the gas to supersonic velocities (30,000–60,000 cm/sec). The energy required to achieve this result is taken from the thermal energy of the gas, which causes a considerable amount of cooling to take place. In addition to high velocities, a supersonic nozzle achieves the desirable result of reducing, by cooling, the temperature differential between the accelerating gas flows and the aerosol, reducing the evaporation of the aerosol before it impacts the substrate surface. However, it should be borne in mind that the temperature of the reactant fluids inside the boundary layer should be sufficient for the desired reaction to proceed. In many instances, it may be necessary to pulse (i.e., switch) the aerosol on and off to achieve higher surface or boundary layer temperatures and higher reaction rates during the period when the aerosol is off.

Two gas nozzles (98, 100) are shown in FIG. 5, however, alternative embodiments may include any practical number of one or more high velocity gas nozzles. In certain instances, it may be desirable to bring more than one reactant gas or vapor to the surface of the wafer either sequentially or concurrently.

Figure 6:
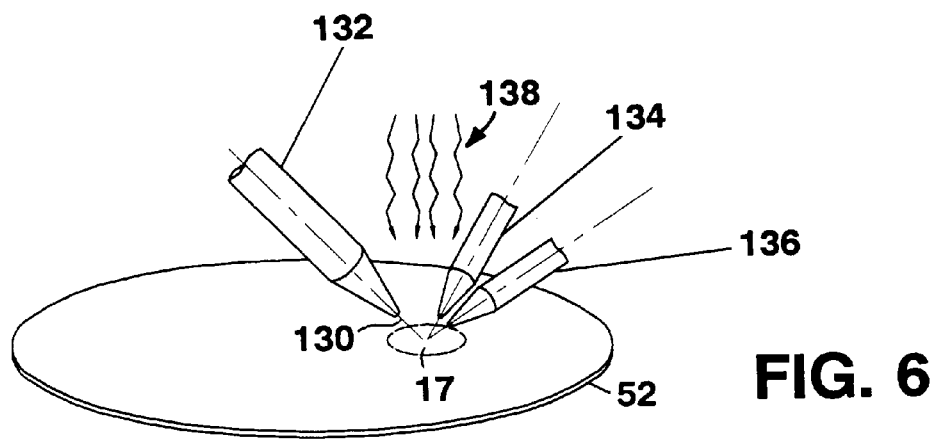
FIGS. 6 and 6A are perspective side and top views of a processing scheme.
Figure 6A:
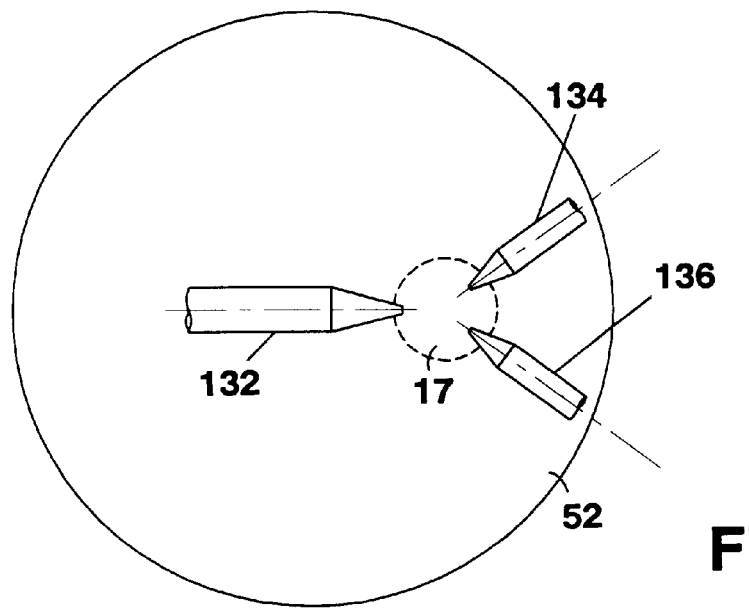

Referring to FIGS. 6 and 6A, an aerosol 130 from an aerosol-generating nozzle 132 can be combined with gases or vapors from nozzles 134 and 136. In addition, radiant energy 138 can be directed to the reaction region 17 to modify or accelerate the reaction.

Figure 7:
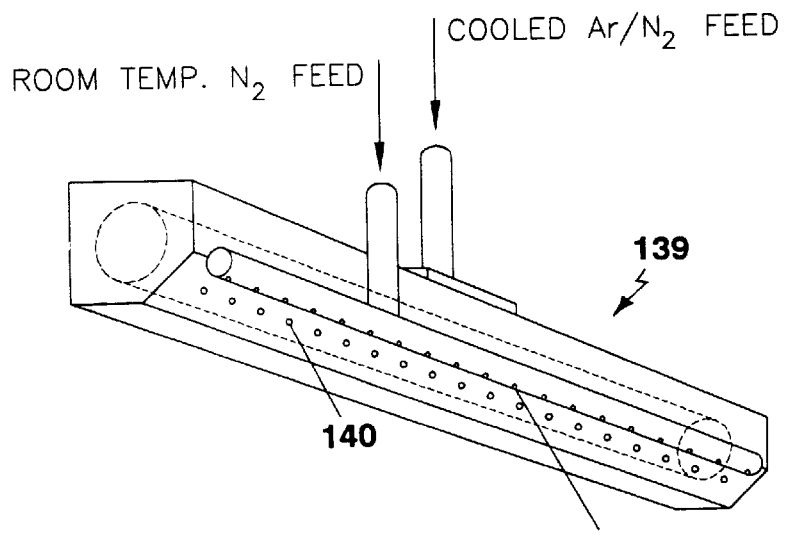
FIG. 7 is a perspective view of an aerosol-generating nozzle.

Referring to FIG. 7, in a combination nozzle configuration 139, a linear array of aerosol generating nozzles 140 is paired with a set of gas nozzles 142, which provide a flow of accelerating and reagent gas. The combined action of the nozzles 140, 142 is to produce an elongated narrow reaction region as wide as the substrate where the cleaning action occurs. In order to obtain a uniform action over the whole substrate, a wafer to be processed would be translated linearly through the reaction region one or more times. In addition, the wafer could be rotated 90° or 180° at the end of each pass so as to improve the uniformity of cleaning of deeply patterned substrates.

Figure 8:
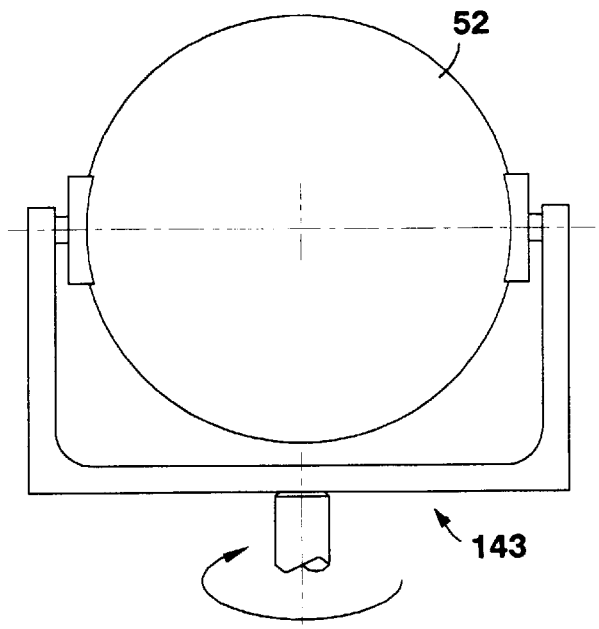
FIGS. 8 and 8A are side views of a gimbals mechanism for adjusting the orientation of a substrate.
Figure 8A:
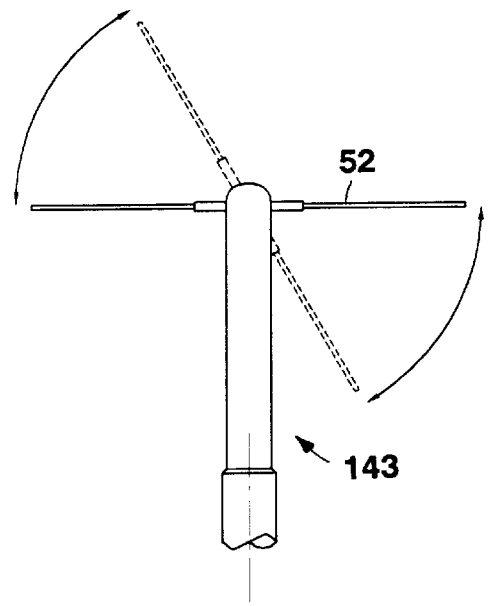
Figure 8B:
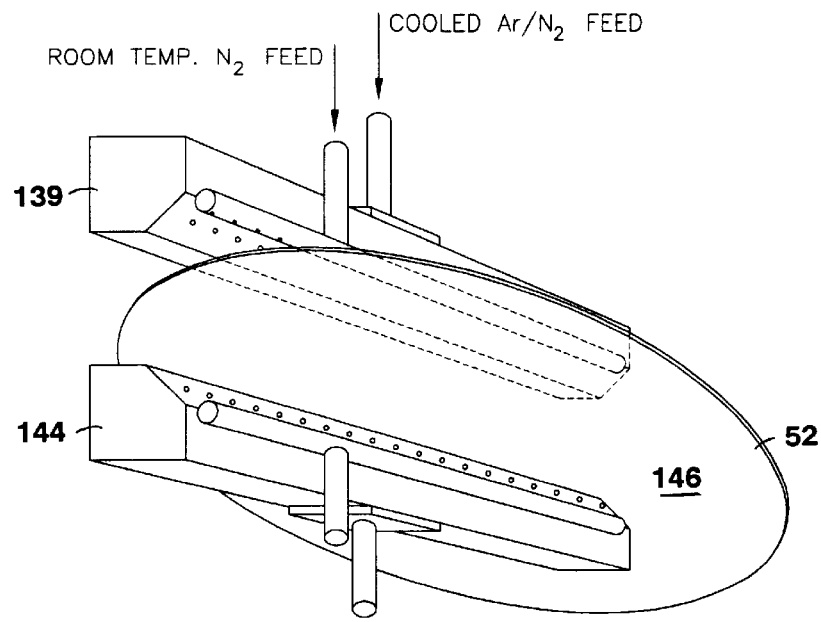
FIG. 8B is a perspective view of two aerosol-generating nozzles disposed on opposite side of a substrate.

When it is necessary to clean both sides of the wafer, the substrate can be flipped by a gimbals mechanism as shown in FIGS. 8 and 8A. Alternatively, a second set of nozzles 144 can be provided which can be simultaneously or separately operated to clean backside 146 of wafer 52, as shown in FIG. 8B. Because the backside of wafer the is for the most part only contaminated by loosely adhering dirt particles, a low velocity aerosol may be enough to clean it, thus avoiding the complication of an additional gas load from the accelerating nozzles.

The shape of the processing chamber is preferably aerodynamically designed to prevent recirculation therein, which would otherwise increase the amount of material redeposited onto the substrate surface. For example, the walls of the processing chamber may converge toward each other from the nozzle to the vacuum exhaust port.

Figure 9:
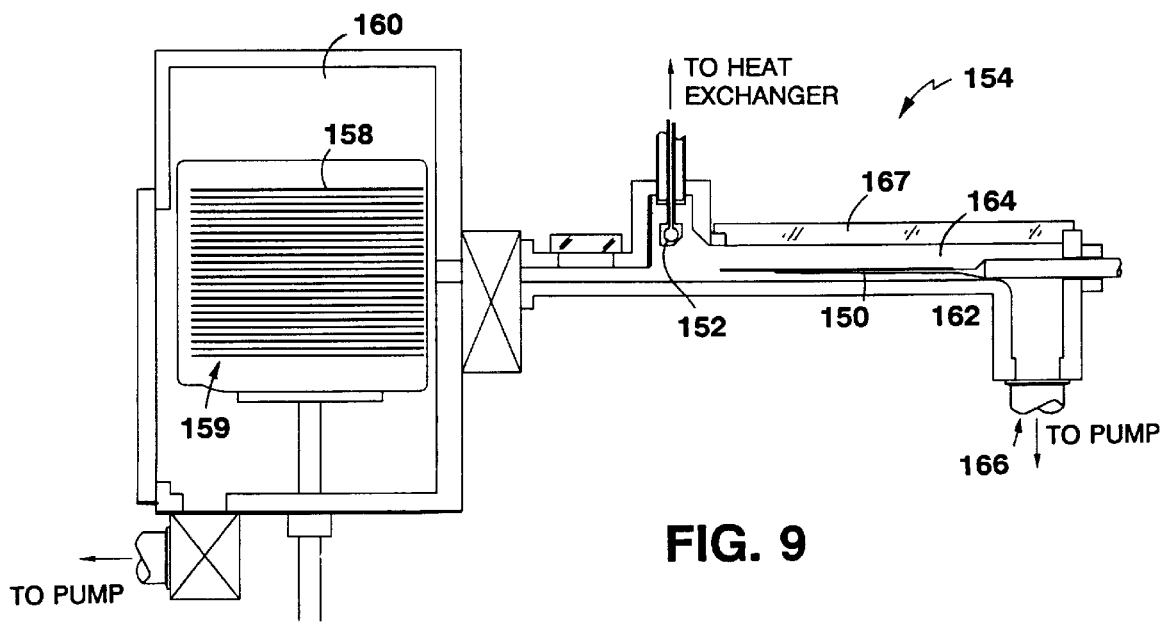
FIGS. 9 and 9A are diagrammatic side and top views of alternative processing systems.

Referring to FIG. 9, in one example of a substrate processing system, a scanning platen 150 and a process nozzle 152 can be integrated into an automated processing system 154. Wafers 158 are loaded from a wafer cassette 159, inside a transfer chamber 160, by a robot arm 162 onto platen 150, within processing chamber 164. Chamber 164 is evacuated during processing through a pump port 166. A window 167 is preferably installed at the top of the processing system to enabled processing monitoring.

Figure 9A:
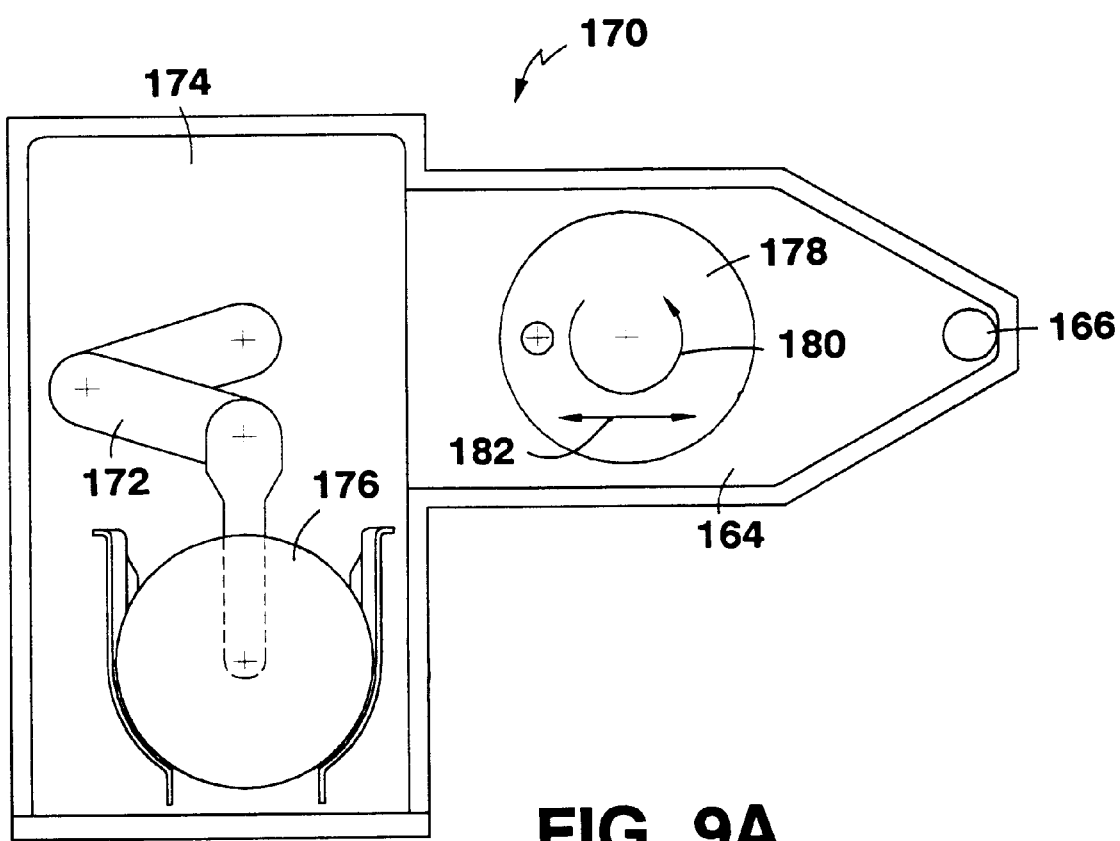

As shown in FIG. 9A, in an alternative cleaning system 170, a robot arm 172, inside a transfer chamber 174, may load wafer 176 onto a scanning platen 178, which can rotate and linearly translate as indicated by arrows 180, 182.

The processing systems of FIGS. 9 and 9A are constructed to have a high throughput capability on the order of 30 to 200 wafers per hour. This processing rate conforms with the processing rate of typical fabrication tools used for semiconductor device manufacture. Because cleaning steps occur so frequently, and it is desirable to avoid multiple and parallel cleaning units, high throughput capability is desirable. Also, due to the construction of processing systems 154, 170 and to the fact that only dry processing is used, these systems are highly compatible with existing vacuum process chambers and can be ready integrated in existing cluster tools to provide rapid wafer processing.

Scanning Systems

As discussed above, in certain preferred embodiments, the area of each cleaning aerosol jet at the substrate surface is on the order of 0.2–2 cm$^2$, which is much less than the total surface area of the substrate, which may be on the order of 300 cm$^2$. Consequently, to achieve uniform exposure of the substrate to the cleaning aerosol, several scanning systems have been devised.

Keeping the area exposed to the cleaning aerosol small provides a number of important advantages. Smaller exposure areas allow smaller aerosol sprays to be used, enabling commercially viable electronic cryogenic refrigerators (e.g., with power requirements on the order of 200–500 watts) to be used rather than liquid nitrogen-based refrigeration systems. Also, use of a smaller exposure area in combination with mechanical scanning achieves more efficient use of the aerosol relative to aerosol cleaning systems that use larger areas of exposure by reducing the amount of aerosol that does not impinge on the substrate.

Referring to FIG. 10, a process gas, which may be a single type of gas or a combination of high purity gases (e.g., argon, nitrogen, helium, oxygen, and hydrogen) mixed in various proportions in a manifold 200, is supplied to a heat exchanger 202 via a supply line 204, which includes a valve 206 and a filter 208. The pressure of the process gas is indicated by a pressure gauge 210. Some or all of the gases are partially or completely liquified at an exit port of the heat exchanger. This liquid is expanded through a nozzle 214 to form a jet 216 of frozen particles made of one or more of the components of the original process gas. These frozen particles impinge on the substrate 218 to be cleaned.

The entire surface of the substrate is cleaned by a combination of fast rotational motion (e.g., on the order of 100 rpm) and slow linear translation, which is provided by the rotary motor 220 and the linear drive 222, respectively. The rotary motor assembly 220 is kept at atmospheric pressure in the sealed enclosure 224 beneath the substrate holder 226. The rotary action is transmitted to the substrate holder via a feed-through 228. Power and control signals are supplied to the motor 220 through cables running through a hollow shaft 232 of linear drive 222.

The nozzle is oriented at 20° to 60° relative to the normal to the substrate 218. This helps entrain and remove impact by-products or other dirty gases by creating a flow across the substrate surface toward a vacuum exhaust port 236. This reduces redeposit of foreign material onto the substrate surface.

Due to the different rotational velocities at radial positions on the substrate, it is beneficial to vary the linear motor speed as a function of linear position of the substrate relative to the cleaning aerosol. For example, to achieve uniform exposure to the cleaning aerosol, the velocity of the linear drive is lowest at the initial location (where the aerosol impinges on the peripheral edge of the substrate), while at the end of the linear sweep (where the aerosol impinges on the central region of the substrate) the velocity is at a maximum. In this way, the surface of the substrate can be uniformly exposed to the cleaning aerosol. It is important to note that in this type of scanning system there is a singularity at the center of rotation which makes it difficult to avoid an over-exposure in the central region of the substrate. Therefore, this scanning method should not be used for processes that are sensitive to over-exposure.

When the gas-liquid transition temperature of the process gases are very close it may be also advantageous to introduce one or more process gases through a manifold 238 placed after the heat exchanger. This assures that some fraction of the gases will remain in gaseous form. This may be important because it effects the velocity of the jet exiting the nozzle. Also, introducing the carrier gas after the heat exchanger reduces the cooling power requirements of the pre-cooler or heat exchanger 202 since the carrier gas is not cooled.

We have realized that the temperature of the aerosol generating nozzle becomes sufficiently low (e.g., on the order of 90–100° K. for an argon aerosol) that reactant gases (e.g., ozone or HF) may condense on the surface of the nozzle and present a hazard for a user. To prevent such condensation, a heat shield 237 disposed in front of the nozzle is maintained at about room temperature or greater, as shown in detail in FIGS. 10A and 10B. A carrier gas 239 (e.g., nitrogen) is delivered around the aerosol generating nozzle so that the pressure surrounding the nozzle is higher than the pressure in the process chamber. This prevents gases in the process chamber from condensing on the cryogenic nozzle. The heat shield includes an orifice to allow the aerosol of at least partially frozen particles to pass therethrough. The orifice may be a circular hole 241, as shown in FIG. 10A. Alternatively, the orifice may be shaped in the form of a converging diverging nozzle 243, as shown in FIG. 10B (e.g., having a shape similar to the nozzle shown in FIG. 5A).

Referring to FIG. 11, in an alternative embodiment, the linear motion is not exerted through the shaft but by a sliding stage 240 driven by the linear actuator 242. The rotary motor 220 is now outside the vacuum and connected to the substrate holder 226 through a sealed shaft 244 and a slot 246 in stage 240. One or more concentric O-rings 252 placed on sliding stage 240 provide the vacuum seal against the bottom of chamber 248. It may be advantageous to add one or more pumping stages 250 between the concentric O-rings 252 to decrease the likelihood of vacuum leaks and to induce a positive pressure differential between the vacuum chamber, which is typically maintained at a pressure of a fraction of an atmosphere, and the pumping stage 250. In this way, any contamination produced at the O-ring seals will be driven away from the process chamber.

In a further embodiment, shown in FIG. 12, two-dimensional exposure of the substrate to the cleaning aerosol is achieved by a combination of slow linear translation of the nozzle and fast rotation of the substrate. A rotary motor 220, which is positioned outside the vacuum chamber 260, drives a vacuum-sealed shaft 262, attached to a substrate holder 264, causing a substrate to be cleaned to be under nozzle 266. The linear motion necessary to expose the whole surface of the substrate is achieved by translation of the nozzle 266.

The cryogenic mixture, which has been precooled in a heat exchanger, is carried to the nozzle by the tube 268 concentric with the bellows 270. This way the necessary linear translation of the nozzle can be achieved by moving the whole heat exchanger 272 by the actuator 274. To facilitate the motion, it is advantageous to rest the heat exchanger on bearings 276.

Applications

Figure 14:
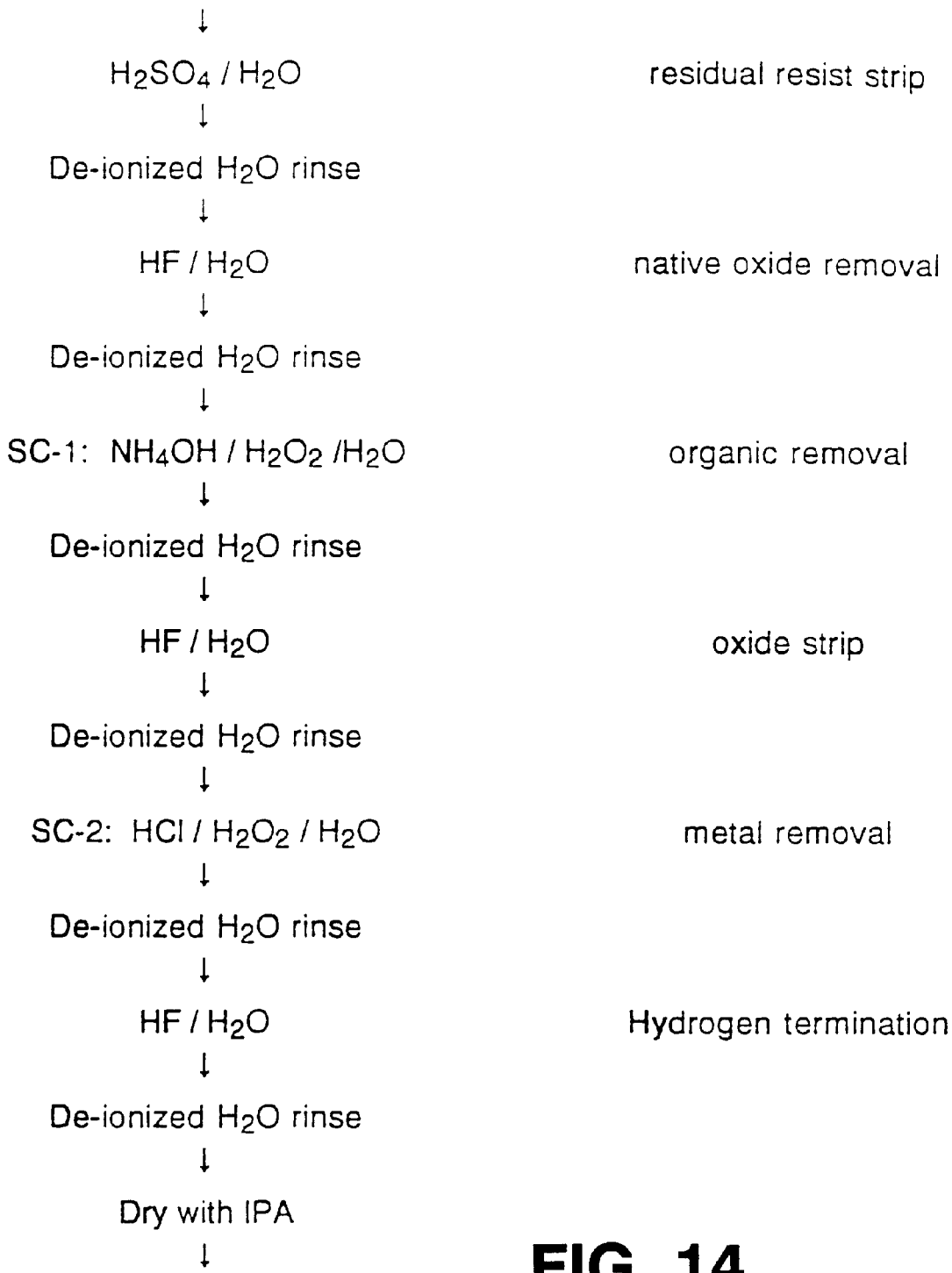
FIG. 14 is a schematic diagram of a typical RCA cleaning sequence.

In each of the following cleaning sequences, the substrate is first introduced into a cleaning chamber by a robotic arm, and after processing, the substrate is removed by the same robotic arm or by a different robotic arm. During processing, the substrate is scanned to obtain uniform processing over the whole substrate surface. Each of the examples presented below may be used, e.g., to replace one or more of cleaning steps of a typical RCA cleaning sequence illustrated in FIG. 14. Because it is well understood that chemical reactions proceed faster at higher temperatures, the aerosol may be pulsed on and off, e.g., at 5 sec intervals, or be used between reactive scans.

EXAMPLE 1

For the removal of oxide layers from the surface of a semiconductor substrate:

| | |
|---|---|
| Step 1 | An argon aerosol flow is started from an aerosol generating nozzle together with a flow of dry nitrogen purge gas |
| Step 2 | A flow of a reactive mixture of $N_2$, HF and $CH_3OH$ is initiated in a gas nozzle at a temperature of 60° C. |
| Step 3 | Simultaneously with Step 2, an IR lamp is turned on to illuminate the reaction region struck by the aerosol and to maintain the temperature of the area being processed between about 90 and 110° C. |
| Step 4 | The $N_2$/HF/$CH_3OH$ gas mixture nozzle is turned off and replaced with a pacification process such as a jet of hydrogen ($H_2$) in combination with the argon aerosol or with the aerosol alone. |
| Step 5 | Remove the semiconductor wafer from the process chamber. |

In addition, to speed up the reaction, 245 nm UV radiation could be used to excite the $F_2$ photochemical absorption reactions.

The above process is a generalized example of a possible processing sequence for oxide removal. The specific details of the cleaning process will depend upon the nature of the substrate and the type of oxide. Native oxides on silicon wafers are thin (5–20 Å), whereas thermally grown oxides are usually thicker, of higher quality and generally harder to remove. The aerosol size and velocity, the reactive mixtures selected and the process temperature will need to be determined by experiment backed by quantitative analysis on the surface which is to be cleaned.

As a further example of the flexibility permitted by gas phase processing, a $F_2/H_2/H_2O$ mixture could be employed instead of the $N_2$/HF/$H_2O$ mixture. The simultaneous presence of an excess of $H_2$ can improve the surface pacification by reduction of Si—F to Si—H bonds during the reaction rather than as an additional step.

EXAMPLE 2

For metal contamination removal:

| | |
|---|---|
| Step 1 | An argon aerosol flow is started from an aerosol generating nozzle together with a flow of dry nitrogen purge gas. |
| Step 2 | A reactive flow of nitrogen and HF containing 1% of water vapor by mass is initiated in a first gas nozzle. |
| Step 3 | The first gas nozzle is shut off and a flow of nitrogen and chlorine containing 1% of water vapor by mass is turned on in a second gas nozzle together with radiation from a source of UV light. |
| Step 4 | The second gas nozzle is shut off and a flow of nitrogen is introduced in the first gas nozzle. |
| Step 5 | The aerosol and nitrogen flows are terminated and the substrate is ready to be removed from the process chamber. |

Prior to removal of the wafer, it may be advantageous to grow a thin protective oxide. This can be done by introducing a flow of ozone through one of the gas nozzles and irradiating the substrate surface with UV light. Thus, processes can be changed or added without removing the substrate from the process chamber.

EXAMPLE 3

For removing organic films from semiconductor substrates.

| | |
|---|---|
| Step 1 | The wafer surface is raised to a temperature of 100° C. by IR irradiation or by back heating. |
| Step 2 | An argon aerosol flow is started from an aerosol generating nozzle together with a flow of dry nitrogen purge gas. |
| Step 3 | A reactive flow of ozone is initiated in a first gas nozzle together with illumination by a $\geq 150$ nm broad spectrum 500 W UV light source. |
| Step 4 | The ozone and UV light irradiation are discontinued and the wafer is subjected to cleaning by an accelerated aerosol containing, e.g., argon or $CO_2$. |
| Step 5 | The aerosol and nitrogen flows are terminated and the wafer is removed from the process chamber. |

Other embodiments are within the scope of the claims.

Figure 13:
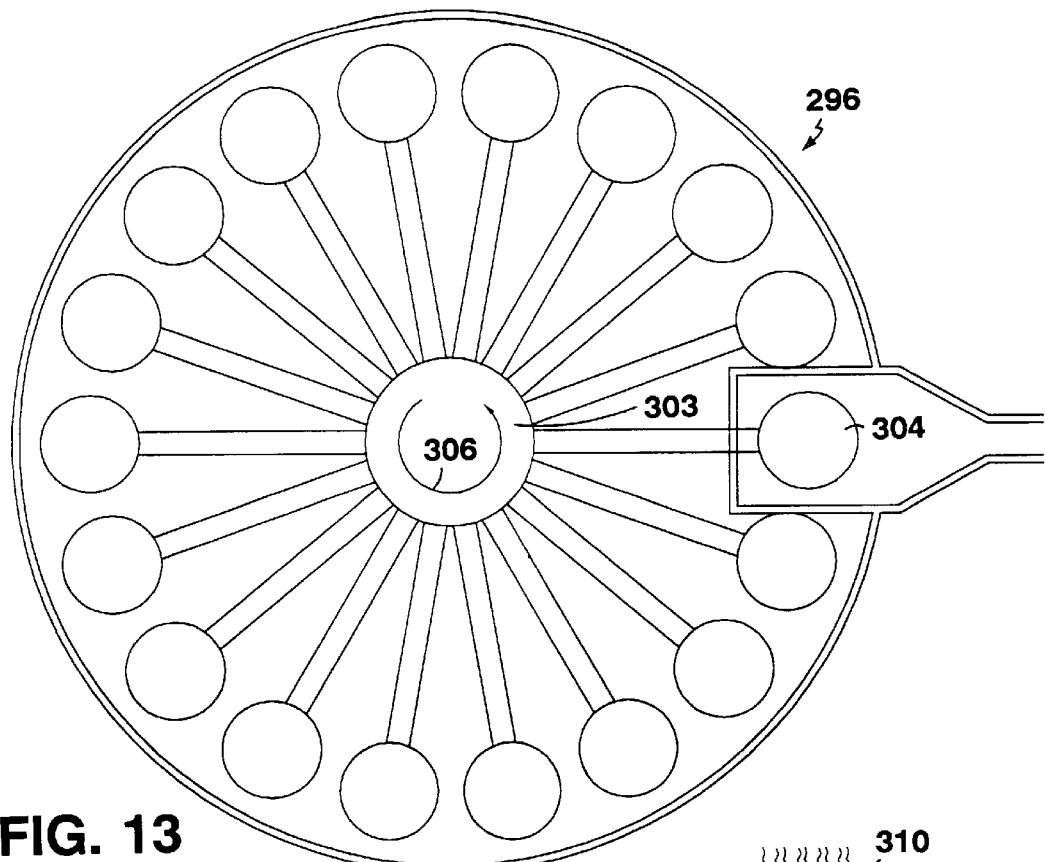
FIG. 13 is a diagrammatic top view of an internal assembly of a batch-type processing system.
Figure 13A:
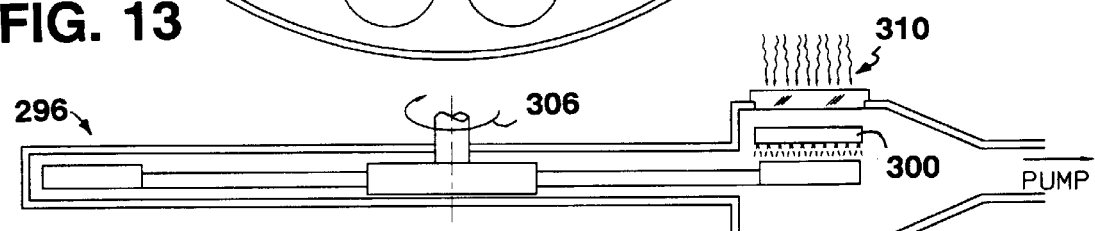
FIGS. 13A and 13B are diagrammatic side views of alternative batch-type processing systems.
Figure 13B:
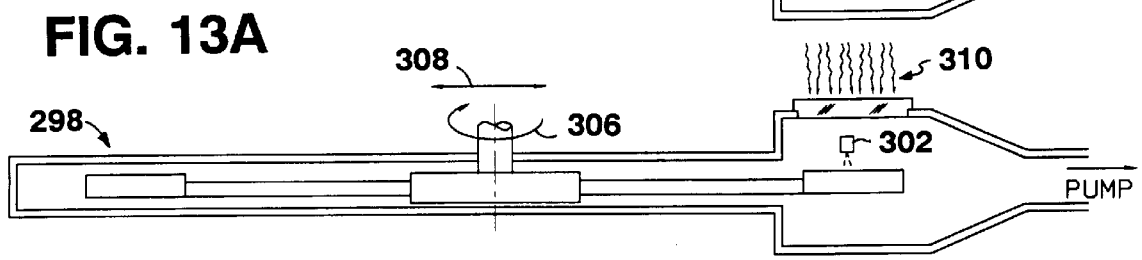

As wafer sizes and therefore the value of the wafers increases, there is a strong trend towards single wafer processing, but in some cases batch-type processing systems 296, 298 may be preferred. In this case, the techniques of this invention can be applied to the configurations shown in FIGS. 13–13B. Uniform processing can be obtained by a carefully designed nozzle bar 300 (FIG. 13A), or by using a single nozzle 302 (FIG. 13B) for directing an aerosol of at least partially frozen particles onto a rotating disc 303 to compensate for the radial dependence of the cleaning action. As in previously-described embodiments, substrates 304 to be processed can be rotated (FIG. 13A) or rotated and linearly translated (FIG. 13B), as indicated by arrows 306, 308, respectively, so that uniform cleaning results are achieved. Also, reaction-enhancing radiation 310 may also be delivered to the vicinity of the reaction region.

What is claimed is:

1. A method for processing foreign material on the surface of a substrate comprising the steps of
   at any given time, providing from a first source a directed flow of a fluid, comprising a reactant, only to foreign material in a limited area reaction region corresponding to a minor fraction of the total area of the substrate,
   simultaneously delivering from a second source an aerosol of at least partially frozen particles to said foreign material in said limited area reaction region to aid the reaction of the reactant with the foreign material to form a reaction product, and
   scanning said substrate to achieve a substantially uniform exposure of the foreign material to said fluid flow and said aerosol of at least partially frozen particles.

2. The method of claim 1 wherein said aerosol of at least partially frozen particles that is delivered aids the reactant react by transferring momentum to the foreign material or to the reaction product sufficient for removal thereof from the substrate surface.

3. The method of claim 1 wherein said limited area reaction region has an elongated length dimension and a width dimension that is narrow relative to the length dimension.

4. The method of claim 1 wherein said step of delivering an aerosol comprises at any given time delivering said aerosol particles only to said limited area reaction region.

5. The method of claim 1 wherein said step of scanning comprises the step of moving said substrate while maintaining the orientation of said directed flow of fluid stationary.

6. The method of claim 5 wherein the step of moving said substrate comprises linearly translating said substrate relative to said directed flow of fluid.

7. The method of claim 5 wherein the step of moving said substrate comprises rotating said substrate about an axis.

8. The method of claim 5 wherein the step of moving said substrate comprises translating said substrate in two orthogonal directions.

9. The method of claim 1 wherein said directed flow of fluid is applied to a limited area reaction region and said substrate is scanned relative to said directed flow of fluid to achieve a substantially uniform exposure of the entire surface of the substrate to the directed flow of fluid in multiple passes, and after each of said passes said aerosol is applied to the entire surface of the substrate to aid the reactant react with the foreign material.

10. The method of claim 1 wherein said step of providing a directed flow of fluid comprises providing a gaseous flow of hydrogen fluoride to the vicinity of the foreign material to be processed.

11. The method of claim 1 wherein said step of providing a directed flow of a fluid comprises providing a gaseous flow of nitrogen or water vapor to the vicinity of the foreign material to be processed.

12. The method of claim 1 wherein said step of providing a directed flow of a fluid comprises providing a flow of isopropyl alcohol vapor to the vicinity of the foreign material to be processed.

13. The method of claim 1 wherein said step of providing a directed flow of a fluid comprises providing a flow of a gaseous mixture of water vapor, nitrogen gas and hydrogen fluoride to the vicinity of the foreign material to be processed.

14. The method of claim 1 wherein said step of providing a flow of a fluid comprises providing a flow of a fluid at a flow rate selected to provide sufficient quantity of reactant to the vicinity of the foreign material for efficient processing.

15. The method of claim 14 wherein said fluid is delivered at a flow rate of at least 1 SCFM.

16. The method of claim 1 wherein the average energy of the particles of said aerosol are selected to achieve efficient cleaning.

17. The method of claim 1 wherein the average size of the aerosol particles is selected to include between $10^7$ and $10^{10}$ atoms per aerosol particle.

18. The method of claim 17 wherein the average energy of the atoms of each aerosol particle is selected to be between 0.0001 eV and 0.01 eV.

19. The method of claim 1 wherein the particles of said aerosol impact said foreign material with an average velocity between 2,000 cm/sec and 30,000 cm/sec.

20. The method of claim 1 wherein the particles of said aerosol impact said foreign material with an average velocity between 5,000 cm/sec and 10,000 cm/sec.

21. The method of claim 1 wherein said at least partially frozen aerosol particles comprise carbon dioxide.

22. The method of claim 1 wherein said at least partially frozen aerosol particles comprise argon.

23. The method of claim 1 wherein said at least partially frozen aerosol particles comprise water.

24. The method of claim 1 wherein said at least partially frozen aerosol particles comprise ammonia.

25. The method of claim 1 wherein said step of delivering an aerosol comprises delivering at least two different aerosols of at least partially frozen particles to the foreign material on the substrate.

26. The method of claim 25 wherein said step of delivering at least two different aerosols comprises delivering an aerosol of at least partially frozen carbon dioxide to the foreign material until said foreign material is processed, and further comprising the step of delivering an aerosol of at least partially frozen argon particles to the surface of the substrate, after said foreign material has been processed.

27. The method of claim 1 further comprising the step of removing said reaction product from the vicinity of the wafer surface.

28. The method of claim 27 wherein said step of removing said reaction product comprises delivering a purge gas to the surface of the substrate.

29. The method of claim 28 wherein said purge gas is delivered is delivered as a laminar flow over the region of the substrate surface where the reaction product forms.

30. The method of claim 27 wherein said step of removing said reaction product comprises the step of providing a process chamber that is aerodynamically shaped to reduce turbulence therein.

31. The method of claim 27 wherein the step of removing said reaction product comprises providing a vacuum exhaust in the vicinity of said substrate.

32. The method of claim 1 wherein said step of delivering said aerosol of at least partially frozen particles comprises transferring to said foreign material by impact momentum sufficient energy to dislodge at least a portion of said foreign material from the substrate surface.

33. The method of claim 1 wherein said step of delivering an aerosol of at least partially frozen particles comprises at any given time delivering said aerosol particles only to said limited area reaction region.

34. The method of claim 1 wherein said limited area reaction region is approximately 0.1 cm$^2$ to 4 cm$^2$ in area.

35. The method of claim 34 wherein said step of delivering an aerosol comprises delivering said aerosol particles to said limited area reaction region.

36. The method of claim 34 further comprising the step of scanning said substrate with said directed flow of fluid to achieve a substantially uniform exposure of said foreign material to said fluid and said aerosol.

37. The method of claim 36 wherein said step of scanning comprises the step of moving said substrate while maintaining said directed flow of fluid stationary.

38. The method of claim 37 wherein the step of moving said substrate comprises linearly translating said substrate relative to said directed flow of fluid.

39. The method of claim 37 wherein the step of moving said substrate comprises rotating said substrate about an axis.

40. The method according to claim 1 for processing metal contamination on a substrate surface
wherein the directed flow of fluid comprises a reactant selected to react with the metal contamination to form a volatile reaction product.

41. The method of claim 40 wherein said reactant that is provided comprises a mixture of a carrier gas, hydrogen fluoride and water vapor.

42. The method of claim 41 wherein the reactant that is provided further comprises a mixture of a carrier gas, chlorine and water vapor.

43. The method of claim 40 further comprising the step of flowing a purge gas over the metallic contamination being processed to aid the removal of the reaction product from the vicinity of the substrate surface.

44. The method according to claim 1 for processing organic contamination on a substrate surface
wherein the directed flow of fluid comprises a reactant selected to react with the organic contamination to form a volatile reaction product.

45. The method of claim 44 further comprising the step of delivering infrared radiation to the substrate to heat the substrate to a temperature of about 100° C.

46. A method for processing foreign material on the surface of a substrate comprising the steps of
providing from a first source a directed flow of a fluid, comprising a reactant, to the surface of the substrate in the vicinity of the foreign material to be processed, and
simultaneously delivering from a second source to the foreign material to be processed an aerosol of at least partially frozen particles to aid the reaction of the reactant with the foreign material to form a reaction product; wherein said aerosol is applied to the foreign material as a series of intermittent pulses.

47. A method for processing foreign material on the surface of a substrate comprising the steps of
providing from a first source a directed flow of a fluid, comprising a reactant, to the surface of the substrate in the vicinity of the foreign material to be processed, and
simultaneously delivering from a second source to the foreign material to be processed an aerosol of at least partially frozen particles to aid the reaction of the reactant with the foreign material to form a reaction product; wherein said aerosol is delivered from an aerosol generating nozzle and through an orifice in a heat shield to prevent condensation of said reactant in the vicinity of said nozzle.

48. The method of claim 47 further comprising the step of providing a flow of a flush gas around said nozzle and through said orifice.

49. The method of claim 48 wherein the orifice of said heat shield has a converging and diverging shape for accelerating said flush gas therethrough.

50. A method for processing foreign material on the surface of a substrate comprising the steps of
providing from a first source a directed flow of a fluid, comprising a reactant, to the surface of the substrate in the vicinity of the foreign material to be processed, and
simultaneously delivering from a second source to the foreign material to be processed an aerosol of at least partially frozen particles to aid the reaction of the reactant with the foreign material to form a reaction product; wherein further comprising the step of delivering light to the foreign material to be processed to aid the reactant react with the foreign material.

51. The method of claim 50 wherein said step of delivering light comprises delivering ultraviolet light to the foreign material to be processed.

52. The method of claim 50 wherein said step of delivering light comprises delivering infrared light to the foreign material to be processed.

53. The method of claim 50 wherein said step of delivering light comprises delivering light having a wavelength that is absorbed by said reactant in a manner increasing the reactivity of the reactant.

54. The method of claim 20 wherein said reactant comprises HF and the light that is delivered to the foreign material to be processed comprises light having a wavelength of about 248 nm.

55. A method for processing an oxide layer on a substrate surface comprising the steps of
providing from a first source a directed flow of a fluid, comprising a reactant selected to react with the oxide layer to form a reaction product, to the surface of the substrate in the vicinity of the oxide layer to be processed, and simultaneously delivering from-a second source an aerosol of at least partially frozen particles to the oxide layer to aid the reactant react with the oxide layer to form a reaction product.

56. The method of claim 55 wherein said reactant that is provided comprises a mixture of a carrier gas, hydrogen fluoride and $CH_3OH$.

57. The method of claim 56 wherein said mixture is provided at a temperature of about 60° C.

58. The method of claim 55 wherein said at least partially frozen aerosol particles that are delivered comprise argon particles.

59. The method of claim 55 further comprising the step of applying light to the oxide layer to be processed.

60. The method of claim 59 wherein said light that is applied comprises infrared light selected to maintain the temperature of the oxide layer to be processed between 90° C. and 110° C.

61. The method of claim 55 further comprising the step of providing, after said oxide layer has been processed, a pacification gas to the vicinity of the processed oxide layer.

62. The method of claim 61 wherein said pacification gas that is provided comprises hydrogen.

63. A method for processing metal contamination on a substrate surface comprising the steps of providing from a first source a directed flow of a fluid, comprising a reactant selected to react with the metal contamination to form a volatile reaction product, to the surface of the substrate in the vicinity of the metal contamination to be processed, simultaneously delivering from a second source an aerosol of at least partially frozen particles to the metal contamination to aid the reactant react with the metal contamination to form a reaction product, and applying ultraviolet light to the metal contamination to be processed.

64. A method for processing metal contamination on a substrate surface comprising the steps of providing from a first source a directed flow of a fluid, comprising a reactant selected to react with the metal contamination to form a volatile reaction product, to the surface of the substrate in the vicinity of the metal contamination to be processed, simultaneously delivering from a second source an aerosol of at least partially frozen particles to the metal contamination to aid the reactant react with the metal contamination to form a reaction product, and providing, after processing, a flow of ozone in the vicinity of the substrate surface, and applying ultraviolet light to the substrate surface, whereby an oxide layer is formed on the surface of the substrate.

65. A method for processing organic contamination on a substrate surface comprising the steps of providing from a first source a directed flow of a fluid, comprising a reactant selected to react with the organic contamination to form a volatile reaction product, to the surface of the substrate in the vicinity of the metal contamination to be processed, simultaneously delivering from a second source an aerosol of at least partially frozen particles to the organic contamination to aid the reactant react with the organic contamination to form a reaction product, and delivering to the organic contamination ultraviolet light having a wavelength greater than 150 nm.

* * * * *